United States Patent
Wakata et al.

(10) Patent No.: US 11,437,461 B2
(45) Date of Patent: Sep. 6, 2022

(54) ROLLABLE DISPLAY PANEL WITH SWITCHED POWER DELIVERY

(71) Applicant: SHARP KABUSHIKI KAISHA, Sakai (JP)

(72) Inventors: Kuniharu Wakata, Sakai (JP); Takeshi Yaneda, Osaka (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 170 days.

(21) Appl. No.: 16/981,156

(22) PCT Filed: Mar. 22, 2018

(86) PCT No.: PCT/JP2018/011425
§ 371 (c)(1),
(2) Date: Sep. 15, 2020

(87) PCT Pub. No.: WO2019/180880
PCT Pub. Date: Sep. 26, 2019

(65) Prior Publication Data
US 2021/0118971 A1    Apr. 22, 2021

(51) Int. Cl.
*H01L 27/32* (2006.01)
*H01L 51/00* (2006.01)

(52) U.S. Cl.
CPC ...... *H01L 27/3276* (2013.01); *H01L 27/3225* (2013.01); *H01L 51/0097* (2013.01); *H01L 2251/5338* (2013.01)

(58) Field of Classification Search
None
See application file for complete search history.

(56) References Cited

U.S. PATENT DOCUMENTS

| | | | | |
|---|---|---|---|---|
| 10,877,523 | B2* | 12/2020 | Huang | G06F 1/1652 |
| 11,032,921 | B2* | 6/2021 | Huang | H05K 5/0017 |
| 11,309,376 | B2* | 4/2022 | Kim | H01L 27/3223 |
| 2015/0029229 | A1* | 1/2015 | Voutsas | G06F 1/1647 |
| | | | | 345/1.3 |
| 2017/0318692 | A1* | 11/2017 | Lee | G06F 1/1658 |
| 2019/0204875 | A1* | 7/2019 | Lee | H01L 51/5237 |
| 2021/0091330 | A1* | 3/2021 | Kim | H01L 27/329 |
| 2021/0204426 | A1* | 7/2021 | Rha | H05K 5/0017 |
| 2021/0405800 | A1* | 12/2021 | Lee | G06F 3/0412 |

FOREIGN PATENT DOCUMENTS

JP    2016-218326 A    12/2016

OTHER PUBLICATIONS

Huitema, Edzer, et al. "10.3: Invited Paper: Rollable Displays: From Concept to Manufacturing." SID Symposium Digest of Technical Papers, vol. 40, No. 1, 2009, p. 104., https://doi.org/10.1889/1.3256468. (Year: 2009).*

* cited by examiner

*Primary Examiner* — J. E. Schoenholtz
(74) *Attorney, Agent, or Firm* — ScienBiziP, P.C.

(57) ABSTRACT

A plurality of switching elements are each provided individually between a second high power supply voltage trunk wiring line and each of a plurality of high power supply voltage wiring lines and input a high power supply voltage to a corresponding high power supply voltage wiring line.

12 Claims, 15 Drawing Sheets

ROLLABLE DISPLAY PANEL WITH SWITCHED POWER DELIVERY

TECHNICAL FIELD

The disclosure relates to a display device including a deformable and flexible display portion.

BACKGROUND ART

PTL 1 discloses a technique for displaying an image by using a deformable and flexible display portion (for example, an electro luminescent (EL) display). Specifically, PTL 1 discloses a display device that displays an image on an unrolled portion (unrolled area) of a rollable display portion.

CITATION LIST

PTL

PTL 1: JP 2016-218326 A (published Dec. 22, 2016)

SUMMARY

Technical Problem

A rolled portion (rolled area) of the display portion has a heat radiation area smaller than that in the unrolled area. When a current flows through the rolled area, the temperature of the rolled area increases, and the display device deteriorates.

Solution to Problem

In order to solve the above-described problem, a display device according to an aspect of the disclosure includes a display portion including a plurality of pixel circuits each including an electro-optical element, the display portion being deformable and flexible, a rolling mechanism configured to roll the display portion and partially accommodate the display portion with a portion of the rolled display portion as a rolled area, a plurality of scanning signal lines extending in a direction intersecting a direction in which the display portion is drawn out from the rolling mechanism, a plurality of data signal lines intersecting the plurality of scanning signal lines and configured to input, to the plurality of pixel circuits, an analog voltage signal corresponding to an image to be displayed on the display portion, and a plurality of high power supply voltage wiring lines parallel to the plurality of data signal lines, in which the electro-optical element includes a first electrode, a second electrode provided in common to a plurality of the electro-optical elements, and a function layer interposed between the first electrode and the second electrode, the plurality of pixel circuits each include a write transistor and a drive transistor, and with a region of the display portion other than the rolled area defined as an unrolled area, and an edge portion of the unrolled area positioned on a side opposite to the rolling mechanism defined as an end portion, the display device further includes: a terminal portion provided in the end portion and configured to input a high power supply voltage to the plurality of high power supply voltage wiring lines from the outside, and input a low power supply voltage to the second electrode from the outside, a first high power supply voltage trunk wiring line provided on a terminal portion side in a frame region of the display portion and branching into the plurality of high power supply voltage wiring lines, a second high power supply voltage trunk wiring line provided on a side opposite to the terminal portion in the frame region and branching into the plurality of high power supply voltage wiring lines, and a plurality of switching elements, each being provided between the second high power supply voltage trunk wiring line and one of the plurality of high power supply voltage wiring lines and configured to input the high power supply voltage to corresponding high power supply voltage wiring lines of the plurality of high power supply voltage wiring lines.

In order to solve the above problems, a display device according to another aspect of the disclosure includes a display portion including a plurality of pixel circuits each including an electro-optical element, the display portion being deformable and flexible, a rolling mechanism configured to roll the display portion and accommodate the display portion with a portion of the rolled display portion as a rolled area, a plurality of scanning signal lines extending in a direction intersecting a direction in which the display portion is drawn out from the rolling mechanism, a plurality of data signal lines intersecting the plurality of scanning signal lines and configured to input, to the plurality of pixel circuits, an analog voltage signal corresponding to an image displayed on the display portion, and a plurality of high power supply voltage wiring lines parallel to the plurality of data signal lines, in which the electro-optical element includes a first electrode, a second electrode provided in common to a plurality of the electro-optical elements, and a function layer interposed between the first electrode and the second electrode, the plurality of pixel circuits each include a write transistor and a drive transistor, and, with a region other than the rolled area in the display portion defined as an unrolled area, and an edge portion of the unrolled area positioned on a side opposite to the rolling mechanism defined as an end portion, the display device further includes a terminal portion provided in the end portion and configured to input a high power supply voltage to the plurality of high power supply voltage wiring lines from the outside, and input a low power supply voltage to the second electrode from the outside, a first high power supply voltage trunk wiring line provided on the terminal portion side in a frame region of the display portion and branching into the plurality of high power supply voltage wiring lines, a second high power supply voltage trunk wiring line provided on a side opposite to the terminal portion in the frame region and branching into the plurality of high power supply voltage wiring lines, a third high power supply voltage trunk wiring line provided in the frame region and connected to the first high power supply voltage trunk wiring line and the second high power supply voltage trunk wiring line, a fourth high power supply voltage trunk wiring line provided on a side opposite to the third high power supply voltage trunk wiring line in the frame region and connected to the first high power supply voltage trunk wiring line and the second high power supply voltage trunk wiring line, a first switching element provided in the third high power supply voltage trunk wiring line and configured to input the high power supply voltage to the second high power supply voltage trunk wiring line, and a second switching element provided in the fourth high power supply voltage trunk wiring line and configured to input the high power supply voltage to the second high power supply voltage trunk wiring line.

In order to solve the above problems, a display device according to still another aspect of the disclosure includes a display portion including a plurality of pixel circuits each including an electro-optical element, the display portion being deformable and flexible, a rolling mechanism configured to roll the display portion and accommodate the display portion with a portion of the rolled display portion as a rolled area, a plurality of scanning signal lines extending in a direction intersecting a direction in which the display portion is drawn out from the rolling mechanism, a plurality of data signal lines intersecting the plurality of scanning signal lines and configured to input, to a corresponding pixel circuit of the plurality of pixel circuits, an analog voltage signal corresponding to an image to be displayed on the display portion, and a plurality of high power supply voltage wiring lines parallel to the plurality of data signal lines, in which the electro-optical element includes a first electrode, a second electrode provided in common to a plurality of the electro-optical elements, and a function layer interposed between the first electrode and the second electrode, the plurality of pixel circuits each include a write transistor and a drive transistor, and, with a region of the display portion other than the rolled area defined as an unrolled area, and an edge portion of the unrolled area located on a side opposite to the rolling mechanism defined as an end portion, the display device further includes, a terminal portion provided in the end portion and configured to input a high power supply voltage to the plurality of high power supply voltage wiring lines from the outside, and input a low power supply voltage to the second electrode from the outside, a first high power supply voltage trunk wiring line provided on a terminal portion side in a frame region of the display portion and branching into the plurality of high power supply voltage wiring lines, a second high power supply voltage trunk wiring line provided on a side opposite to the terminal portion in the frame region and branching into the plurality of high power supply voltage wiring lines, a third high power supply voltage trunk wiring line provided in the frame region and intersecting the first high power supply voltage trunk wiring line, a fourth high power supply voltage trunk wiring line provided on a side opposite to the third high power supply voltage trunk wiring line in the frame region, a plurality of intersecting high power supply voltage wiring lines that intersect the plurality of high power supply voltage wiring lines and branch off from the third high power supply voltage trunk wiring line and the fourth high power supply voltage trunk wiring line, a plurality of first switching elements, each being provided between the third high power supply voltage trunk wiring line and one of the plurality of intersecting high power supply voltage wiring lines and configured to input the high power supply voltage to corresponding high power supply voltage wiring lines of the plurality of high power supply voltage wiring lines, and a plurality of second switching elements, each being provided between the fourth high power supply voltage trunk wiring line and one of the plurality of crossover high power supply voltage wiring lines and configured to input the high power supply voltage to corresponding intersecting high power supply voltage wiring lines of the plurality of high power supply voltage wiring lines.

Advantageous Effects of Disclosure

With the display device according to the aspects of the disclosure, it is possible to prevent deterioration of a display device due to an increase in the temperature of a rolled area.

DESCRIPTION OF EMBODIMENTS

First Embodiment

Figure 1:
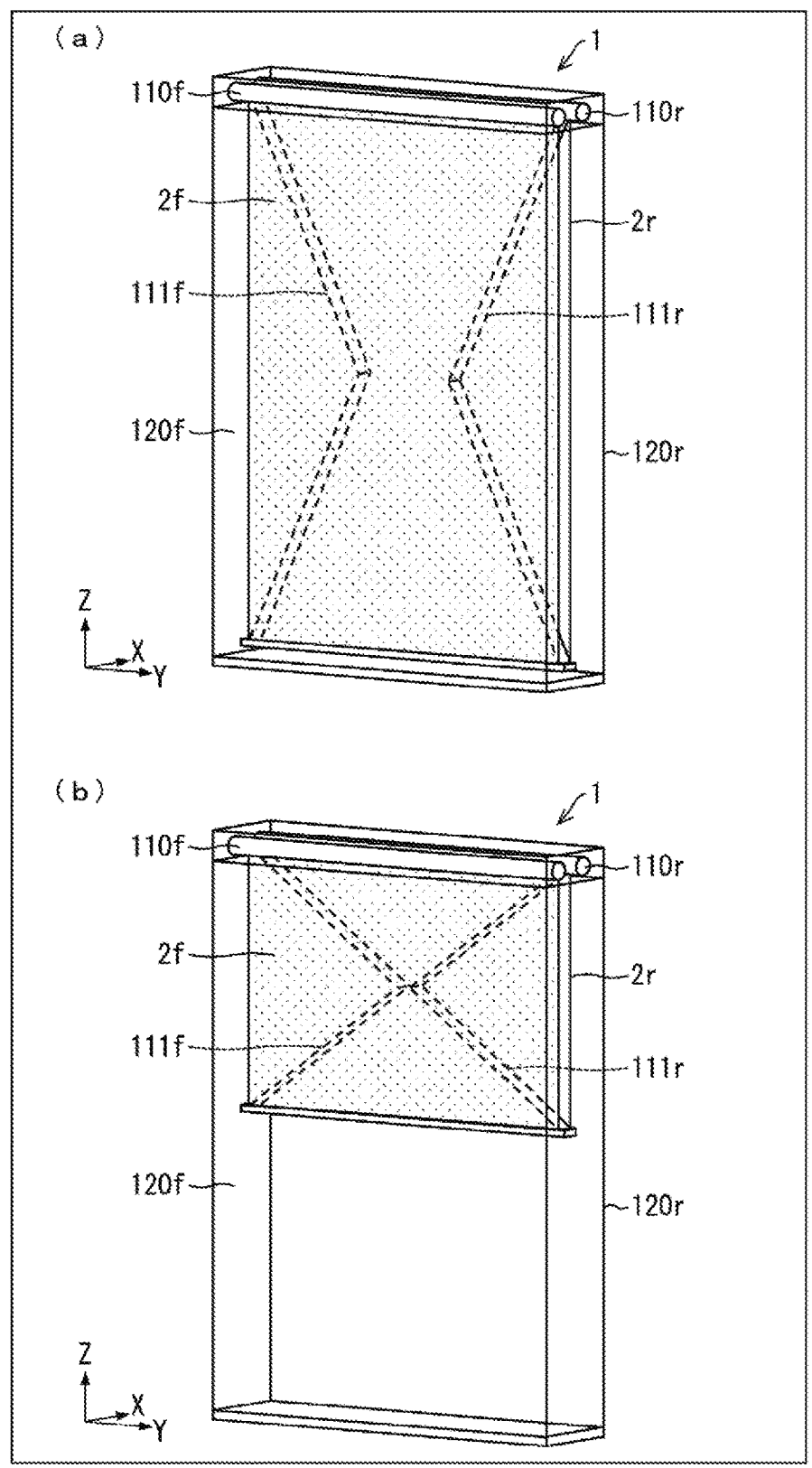
FIG. 1(a) is a perspective view illustrating a state where a display portion in a display device according to a first embodiment is not rolled.
FIG. 1(b) is a perspective view illustrating a state where a portion of the display portion is rolled.

Hereinafter, a first embodiment of the disclosure will be described with reference to FIGS. 1 to 10. In the first embodiment, a display device 1 including a flexible display portion (for example, an EL display) on front and rear surfaces is described. Hereinafter, for convenience of description, the two display portions will also be referred to as a display portion 2f and a display portion 2r in order to distinguish the display portions from each other. When there is no need to distinguish between the two display portions 2f and 2r, the display portions are collectively referred to as the display portion 2.

Note that various members of the display device 1 are illustrated in the drawings described later, and members that are not related to the first embodiment are not described. It may be understood that members that are not described are similar to those known in the art. In addition, the drawings are merely intended to schematically describe the shapes, structures, and positional relationships of the members and are not necessarily drawn to scale.

Outline of Display Device 1

First, an outline of the display device 1 will be described with reference to FIG. 1. (a) of FIG. 1 is a perspective view illustrating a state where the display portion 2 in the display device 1 according to the first embodiment is not rolled, and (b) of FIG. 1 is a perspective view illustrating a state where a portion of the display portion 2 is rolled. The display device 1 includes the display portions 2f and 2r, rolling mechanisms 110f and 110r, and protecting members 120f and 120r. The rolling mechanisms 110f and 110r include link members 111f and 111r (for example, pantograph links), respectively. The rolling mechanisms 110f and 110r may be collectively referred to as a rolling mechanism 110 (see FIG. 5 described later).

Note that the rolling mechanism 110f, the link member 111f, and the protecting member 120f are members provided for the display portion 2f. Furthermore, the rolling mechanism 110r, the link member 111r, and the protecting member 120r are members provided for the display portion 2r.

In the following description, only the rolling mechanism 110f, the link member 111f, and the protecting member 120f will be described, except when particularly necessary otherwise. The functions of the rolling mechanism 110r, the link member 111r, and the protecting member 120r are the same as those of the rolling mechanism 110f, the link member 111f, and the protecting member 120f, and thus these functions will not be described. The same applies to other members with the suffixes "f" and "r" to be described later (for example, position sensors 50f and 50r in FIG. 5).

Hereinafter, for convenience of description, a long-side direction of the display portion 2f (that is, the display portion 2f illustrated in (a) of FIG. 1 to be described later) in an unrolled state to be described later will be referred to as a Z-direction. In the first embodiment, a negative direction of the Z-direction is a downward direction. A positive direction of the Z-direction may also be referred to as an upward direction. The Z-direction may be referred to as a height direction (up-down direction). The Z-direction may be a vertical direction or may be a horizontal direction (a direction perpendicular to the vertical direction).

A short-side direction of the display portion 2f in an unrolled state is referred to as a Y-direction. The Y-direction may be referred to as a width direction. A direction orthogonal to the Y-direction and the Z-direction is referred to as an X-direction. The X-direction may also be referred to as a depth direction.

The display portion 2f (first display portion) is a deformable and flexible display portion. The display portion 2f may be a known EL display (for example, an organic EL display). More specifically, the display portion 2f is formed into a sheet shape (film shape) so as to be rollable.

A side of the display portion 2f on which an active area (display region) is provided (a side in a negative direction of an X-axis in FIG. 1) is referred to as a front side of the display portion 2f. A side opposite to the front side of the display portion 2f is referred to as a back side of the display portion 2f. The display portion 2f displays (presents) an image to a user (viewer) facing the front side of the display portion 2f.

The display portion 2r (second display portion) is provided with an active area on a side opposite to the display portion 2f. The side of the display portion 2r provided with the active area (a side in a positive direction of the X-axis in FIG. 1) is referred to as the front side of the display portion 2r. A side opposite to the front side of the display portion 2r is referred to as a rear side of the display portion 2r. The display portion 2r displays an image to a user facing the front side of the display portion 2r.

When the display portions 2f and 2r are provided as illustrated in FIG. 1, the front side of the display portion 2r is located on the back side of the display portion 2f. In addition, the back side of the display portion 2r is located on the front side of the display portion 2f. Thus, the display device 1 can display an image on a side in the negative direction and on a side in the positive direction of the X-axis in FIG. 1. The display device 1 may be used as, for example, double-sided signage.

The rolling mechanism 110f is a mechanism used for rolling up (winding up or winding) the display portion 2f. The rolling mechanism 110f rolls up the display portion 2f by reducing a length H of the link member 111f in the height direction. In addition, the rolling mechanism 110f increases the length H to at least partially draw out (send out) an unrolled area (described later) to the outside of the rolling mechanism 110f. The rolling mechanism 110f includes a drive unit (for example, a motor), which is not illustrated in the drawing, for operating the link member 111f. The structure of the link member 111f is a known structure, and thus will not be described.

In the first embodiment, for convenience of description, a case where the display portion 2f (unrolled area) is drawn out in a downward direction (for example, the vertical direction) of the rolling mechanism 110f is illustrated. However, the direction in which the rolling mechanism 110f draws out the display portion 2f is not particularly limited. The direction may be, for example, a direction opposite to the vertical direction, or may be a direction (horizontal direction) orthogonal to the vertical direction.

(a) of FIG. 1 is a perspective view illustrating a state where the display portion 2f is not rolled (unrolled state). Here, the natural length of the display portion 2f in the Z-direction is referred to as a length L0 (maximum length). In addition, a length in the height direction from the rolling mechanism 110f (more specifically, a lower edge of the rolling mechanism 110f) to a lower edge of the display portion 2f is referred to as a length La (exposed length). In the unrolled state, La=L0.

The rolling mechanism 110f operates the link member 111f, and sets the length H to be equal to the length L0 to maximally roll out display portion 2f. That is, the rolling mechanism 110f increases La to L0 to place the display portion 2f in an unrolled state.

Hereinafter, an unrolled portion of the display portion 2f (a portion suspended below the rolling mechanism 110f with the length La) will be referred to as an unrolled area. In the unrolled state, the entire display portion 2f is the unrolled area. In the unrolled state, the entire display portion 2f is provided to a user as a region where the user can view an image (visible region).

(b) of FIG. 1 is a perspective view illustrating a state where a portion of the display portion 2f is rolled (a partially rolled state). The rolling mechanism 110f makes the length La shorter than the length L0 by operating the link member 111f. That is, the rolling mechanism 110f rolls up the display portion 2f to place the display portion 2f in the partially rolled state.

In the partially rolled state, a rolled portion of the display portion 2f is referred to as a rolled area. In the partially rolled state, the rolled area of the display portion 2f is accommodated inside the rolling mechanism 110f. When the length of the rolled area of the display portion 2f is referred to as Lb (unexposed length, accommodated length), Lb=L0−La. In the partially rolled state, 0<Lb<L0. Note that, in the unrolled state described above, Lb=0.

In the partially rolled state, the rolled area of the display portion 2f is a region where a user cannot view an image (non-visible region). That is, the unrolled area, which is the entire area of the display portion 2f excluding the rolled area, is provided to the user as a visible region. As described later, the display device 1 displays an image only in the unrolled area of the display portion 2f in the partially rolled state.

The protecting member 120f is a plate-like member formed of a transparent material such as glass or a resin. The protecting member 120f is provided to protect the display portion 2f without impairing the visibility of a user viewing an image displayed on the display portion 2f. Providing the protecting member 120f makes it possible to, for example, prevent a user from touching the display portion 2f with his or her hand.

Figure 2:
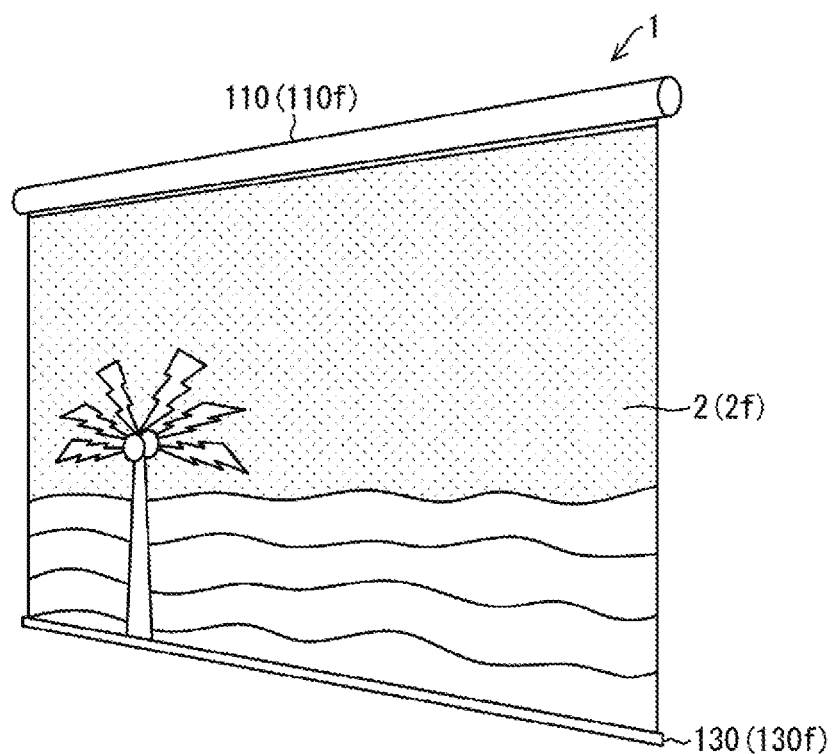
FIG. 2 is a diagram schematically illustrating a configuration of the display portion.

FIG. 2 is a diagram schematically illustrating a configuration of the display portion 2. In FIG. 2, for convenience of description, only the display portion 2f in an unrolled state is illustrated. In addition, the link member 111f and the protecting member 120f are not illustrated in FIG. 2. As illustrated in FIG. 2, a lower edge of the display portion 2f includes an edge portion 130f (end portion). The edge portion 130f is an edge portion of the unrolled area located on a side opposite to the rolling mechanism 110f.

Figure 4:
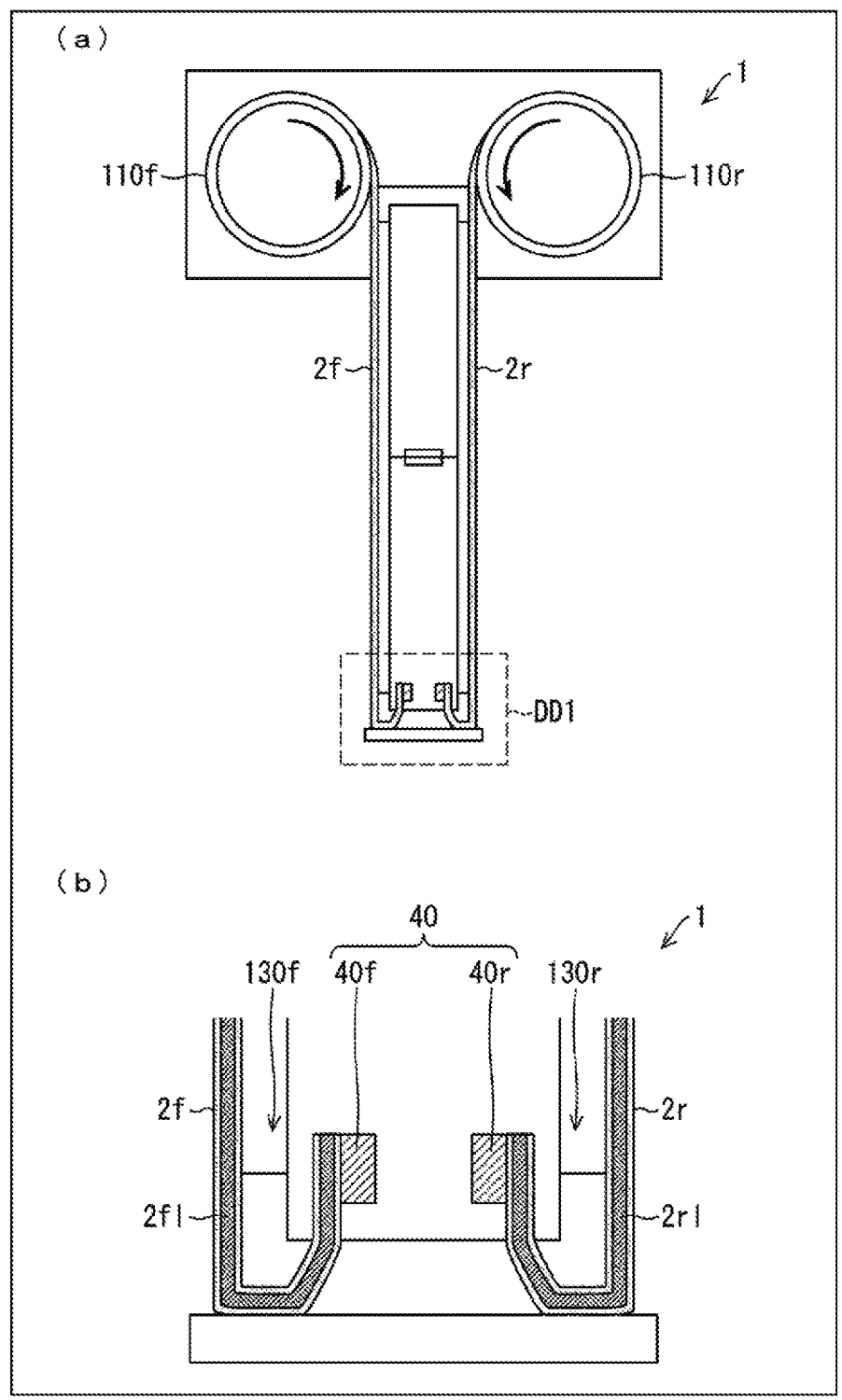
FIG. 4(a) is a side view schematically illustrating a configuration of the display device according to the first embodiment from the side.
FIG. 4(b) is an enlarged view of a region DD1 in FIG. 4(a).

As illustrated in FIG. 4(a) to be described later, a terminal portion 40f is provided at the edge portion 130f of the display portion 2f. In addition, as illustrated in (b) of FIG. 4, an edge portion 130r (end portion) similar to the edge portion 130f is provided in the display portion 2r. Furthermore, a terminal portion 40r similar to the terminal portion 40f is provided at a U-shaped edge portion of the edge portion 130r. The edge portions 130f and 130r and the terminal portions 40f and 40r may be collectively referred to as an edge portion 130 (end portion) and a terminal portion 40, respectively. The terminal portion 40 provided at the edge portion 130 may be used as a terminal for the display device 1 to receive input of an external signal.

Figure 3:
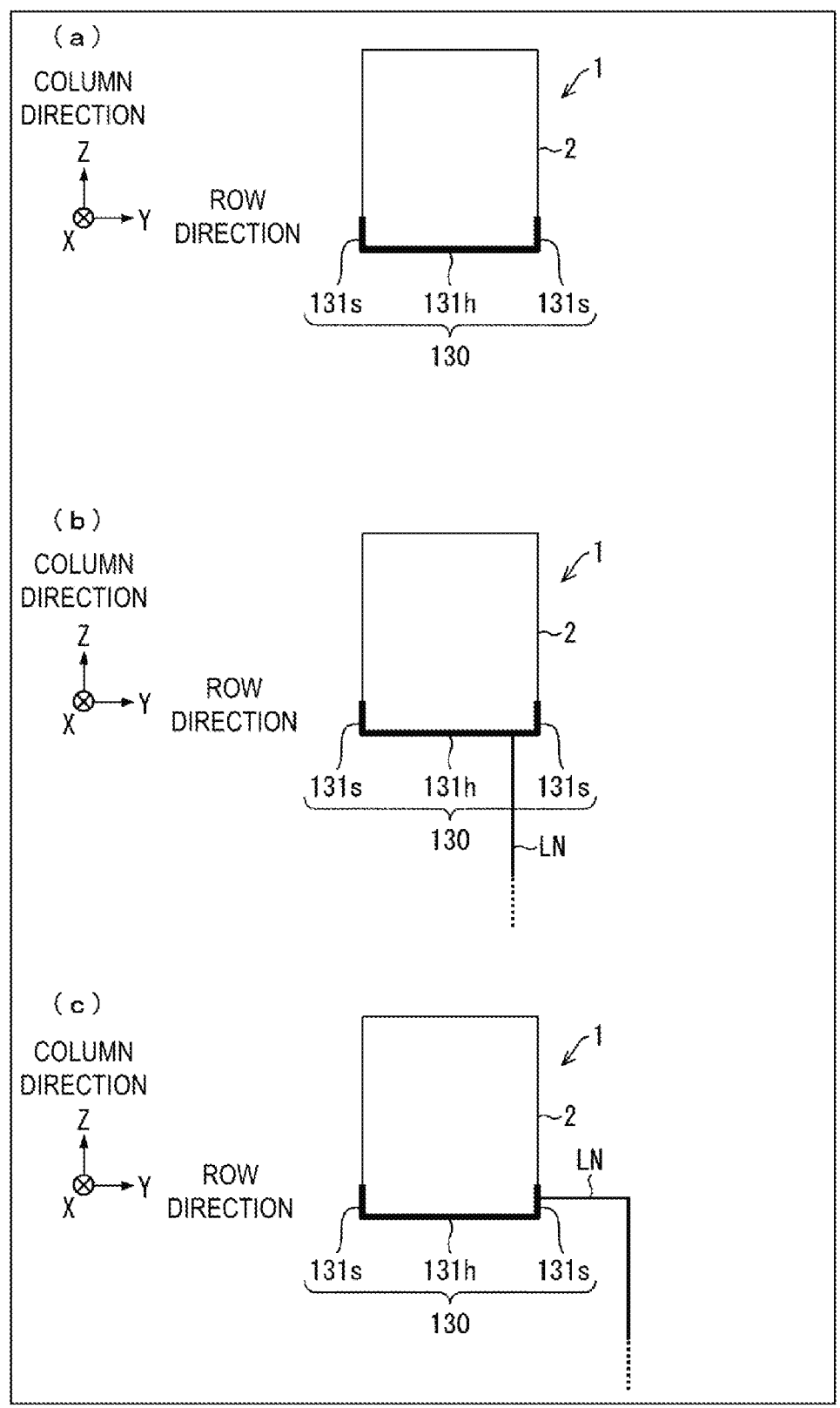
FIGS. 3(a) to 3(c) are diagrams illustrating an edge portion.

(a) to (c) of FIG. 3 are diagrams for describing the edge portion 130 (end portion). As illustrated in (a) of FIG. 3, the edge portion 130 includes a primary end portion 131h and a side end portion 131s.

The primary end portion 131h is a portion of the edge portion 130 that is parallel to the Y-direction (a second direction or a row direction to be described later). The side end portion 131s is a portion of the edge portion 130 that is parallel to the Z-direction (a first direction or a column direction to be described later). In the display portion 2, two side end portions 131s connecting with the primary end portion 131h are provided on the side of one primary end portion 131h.

As illustrated in (b) of FIG. 3, the edge portion 130 may be electrically connected to a wiring line LN extending in the Z-direction by the primary end portion 131h. By providing the primary end portion 131h, the terminal portion 40 can be electrically connected to the wiring line LN extending in the Z-direction.

Additionally, as illustrated in (c) of FIG. 3, the edge portion 130 may be electrically connected to a wiring line LN extending in the Y-direction by the side end portion 131s. By providing the side end portion 131s, the terminal portion 40 can be electrically connected to the wiring line LN extending in the Y-direction.

(a) of FIG. 4 is a side view schematically illustrating the configuration of the display device 1 illustrated in FIG. 1 from the side. (b) of FIG. 4 is an enlarged view of the region DD1 in (a) of FIG. 4 (a region including the vicinity of the lower ends of the display portions 2f and 2r). As illustrated in (b) of FIG. 4, the edge portion 130f is provided with the terminal portion 40f. Specifically, the edge portion 130f includes a substantially U-shaped edge portion (hereinafter, U-shaped edge portion) that curves from the front side toward the back side and from the lower side toward the upper side of the display portion 2f. The terminal portion 40f is provided at the edge portion of the edge portion 130f.

Because the terminal portion 40f is provided in this manner, the terminal portion 40f is not visible to a user positioned in front of the display device 1 (a user viewing an image displayed on the display portion 2f). Thus, even when the terminal portion 40f is provided, display quality of the display portion 2f can be maintained. A wiring portion 2fl for connecting the terminal portion 40f to another member is provided inside the edge portion 130f.

As described above, the edge portion 130r similar to the edge portion 130f is provided at the lower edge of the display portion 2r. Furthermore, the terminal portion 40r similar to the terminal portion 40f is provided on the U-shaped edge portion of the edge portion 130r. A wiring portion 2rl similar to the wiring portion 2fl is provided inside the edge portion 130r.

Configuration of Main Portion of Display Device 1

Figure 5:
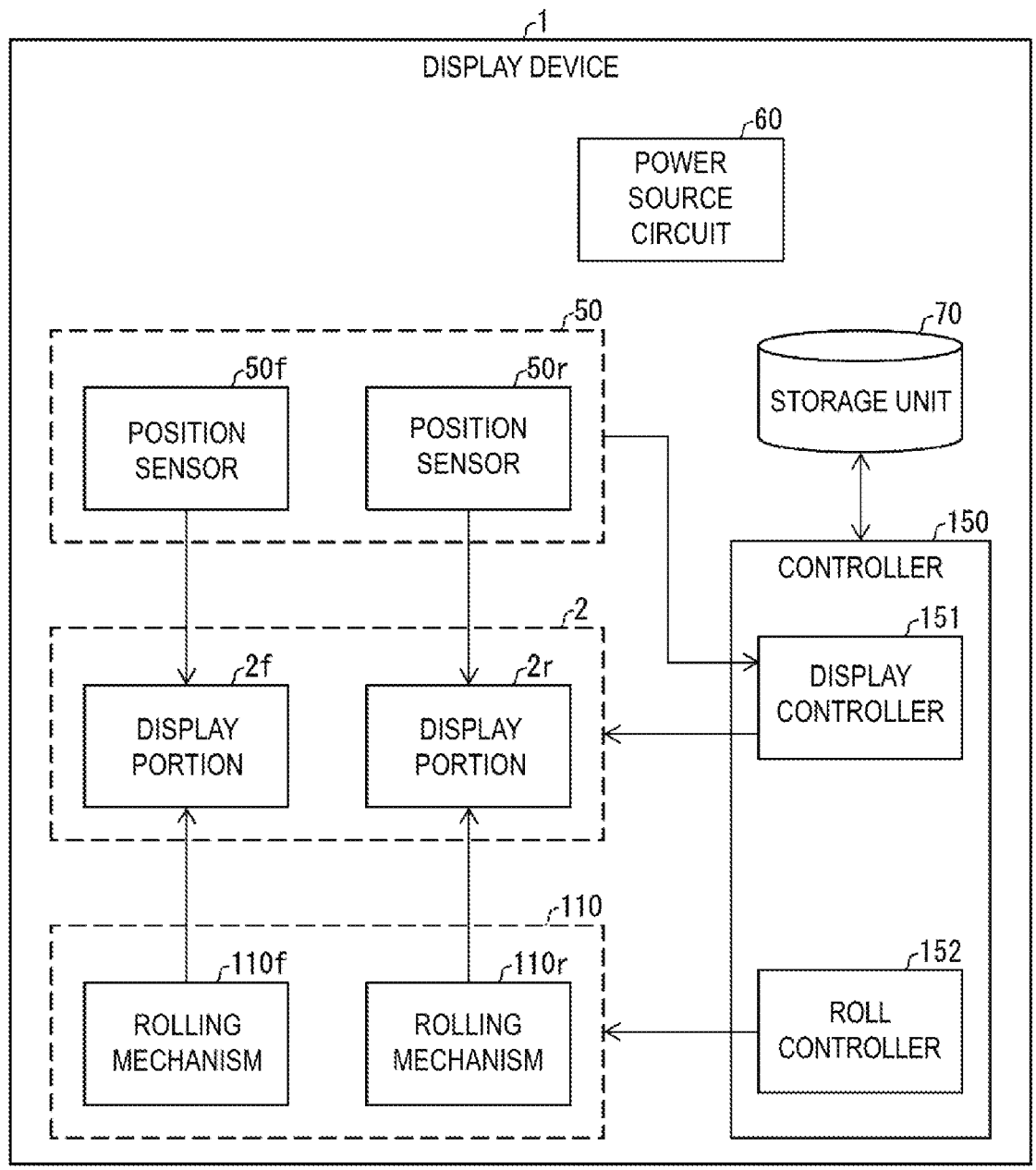
FIG. 5 is a functional block diagram illustrating a configuration of a main portion of the display device according to the first embodiment.

FIG. 5 is a functional block diagram illustrating configuration of a main portions of the display device 1. The display device 1 further includes position sensors 50f and 50r, a power source circuit 60, a storage unit 70, and a controller 150. The position sensors 50f and 50r may be collectively referred to as a position sensor 50.

The position sensor 50 is a sensor configured to detect the unrolled area of the display portion 2. The position sensor 50 may be, for example, an electrostatic capacitive sensor (for example, a touch sensor) or an optical sensor. In a case where an optical sensor is used as the position sensor 50, a light-emitting element ES (electro-optical element) to be described later may be used as a light-receiving element of the optical sensor.

Figure 6:
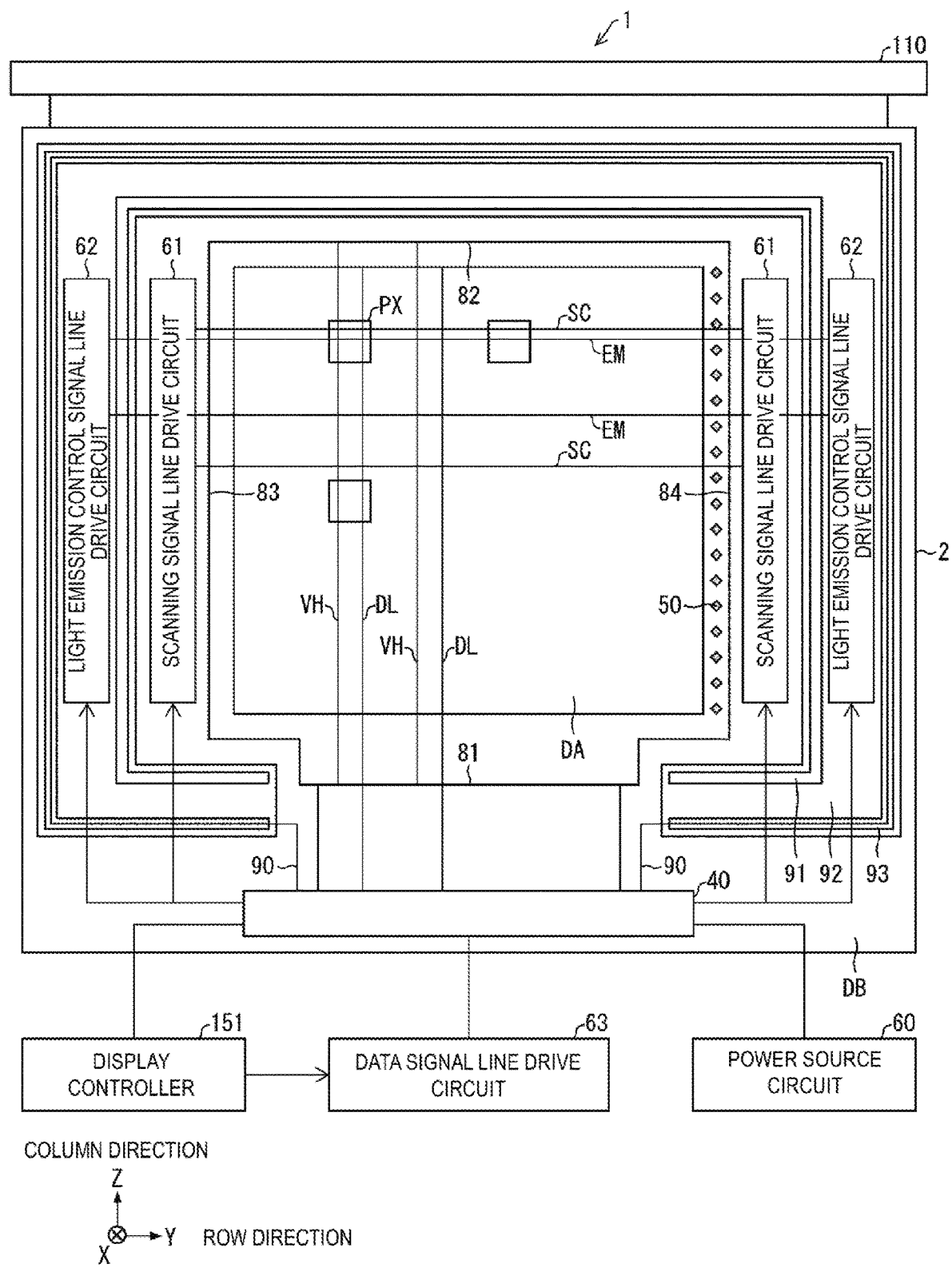
FIG. 6 is a plan view illustrating a detailed configuration of the display device according to the first embodiment.

As illustrated in FIG. 6 and other figures to be described later, a plurality of the position sensors 50 are disposed regularly in the display portion 2 along the Z-direction (first direction, row direction). However, the position sensors 50 may be provided outside the display portion 2.

The power source circuit 60 supplies power to each unit of the display device 1. As described later, the power source circuit 60 supplies a voltage to each of a plurality of pixel circuits PX to be described later.

The controller 150 comprehensively controls each unit of the display device 1. The function of the controller 150 may be implemented through a central processing unit (CPU) executing programs stored in the storage unit 70. The storage unit 70 stores various programs executed by the controller 150 and data used by those programs.

The controller 150 includes a display controller 151 and a roll controller 152. The roll controller 152 controls the operation of the rolling mechanism 110. The roll controller 152 may operate the drive unit of the rolling mechanism 110 in accordance with a user's input operation, and may change the length H described above (in other words, the length Lb). Thereby, a user can change the length La described above to a desired length. That is, the size of the unrolled area (visible region) can be changed arbitrarily.

Note that the user's input operation to the display device 1 is preferably performed through wireless communication using a remote controller or the like. In this case, the display device 1 does not need to be provided with an input unit, and thus the design of the display device 1 can be improved. However, the display device 1 may be provided with an input unit.

The display controller 151 controls the operation of the display portion 2. The display controller 151 may display an image only in the unrolled area of the display portion 2 on the basis of detection results of the position sensor 50. An example of display control for the display portion 2 performed by the display controller 151 will be described later.

Detailed Configuration of Display Device 1

FIG. 6 is a plan view illustrating a detailed configuration of the display device 1. The display device 1 further includes the plurality of pixel circuits PX. Each of the pixel circuits PX is a pixel circuit corresponding to one pixel of the display portion 2. In the display portion 2, a number of the plurality of pixel circuits PX equal to the number of pixels in the display portion 2 is disposed in a spatially regular manner.

Each of the pixel circuits PX includes a light-emitting element ES. The light-emitting element ES is a light source used for lighting pixels corresponding to each pixel circuit PX. The light-emitting element ES is an electro-optical element where luminance or transmittance is controlled by a current. Examples of a current-controlled electro-optical element include an organic light-emitting diode (OLED), an inorganic light-emitting diode, and a quantum dot light-emitting diode (QLED).

An OLED includes, for example, a first electrode (for example, an anode), a second electrode (for example, a cathode) formed on the first electrode, and a light-emitting layer between the first electrode and the second electrode. A voltage equal to or greater than a threshold value of the light-emitting layer can be applied between the first electrode and the second electrode to apply a drive current (active current) to the light-emitting layer and cause the light-emitting layer to emit light.

Thus, the display device may be any display device provided that the display portion 2 is flexible and the display device includes a bendable light-emitting element ES (electro-optical element). The display portion 2 may be an organic electro luminescent (EL) display including an OLED, or an inorganic EL display including an inorganic light-emitting diode. As such, the display portion 2 may be an EL display. Alternatively, the display portion 2 may be a QLED display including a QLED.

The display portion 2 includes a display region DA and a frame region DB that surrounds the display region DA. The terminal portion 40 is provided at an end portion of an unrolled area of the display device 1 in the frame region DB.

The display device 1 further includes a pair of scanning signal line drive circuits 61, a pair of light emission control signal line drive circuits 62, a data signal line drive circuit 63, a plurality of scanning signal lines SC, a plurality of light emission control signal lines EM, and a plurality of data signal lines DL.

One of the pair of scanning signal line drive circuits 61 is provided on the left side of the display region DA in the frame region DB of the display portion 2, and the other is provided on the right side of the display region DA in the frame region DB. The plurality of scanning signal lines SC extend in the Y-direction intersecting the Z-direction in which the display device 1 is drawn out from the rolling mechanism 110. The plurality of scanning signal lines SC are disposed parallel to each other. Each scanning signal line SC is electrically connected to a single row of pixel circuits PX in the display region DA. One end of each of the plurality of scanning signal lines SC is electrically connected to one scanning signal line drive circuit 61. The other end of each of the plurality of scanning signal lines SC is electrically connected to the other scanning signal line drive circuit 61. Each of the scanning signal line drive circuits 61 drives the plurality of scanning signal lines SC by inputting scanning signals to the plurality of scanning signal lines SC. Each of the scanning signal lines SC inputs the scanning signal input from the scanning signal line drive circuit 61 to the pixel circuit PX electrically connected to that scanning signal line SC.

One of the pair of light emission control signal line drive circuits 62 is provided on the left side of one scanning signal line drive circuit 61 in the frame region DB of the display portion 2, and the other is provided on the right side of the other scanning signal line drive circuit 61 in the frame region DB of the display portion 2. The plurality of light emission control signal lines EM are disposed parallel to the plurality of scanning signal lines SC and parallel to each other. The plurality of light emission control signal lines EM correspond to the plurality of scanning signal lines SC on a one-to-one basis. Each of the light emission control signal lines EM is electrically connected to a single row of pixel circuits PX in the display region DA. One end of each of the plurality of light emission control signal lines EM is electrically connected to one light emission control signal line drive circuit 62. The other end of each of the plurality of light emission control signal lines EM is electrically connected to the other light emission control signal line drive circuit 62. Each of the light emission control signal line drive circuits 62 drives the plurality of light emission control signal lines EM by inputting light emission control signals to the plurality of light emission control signal lines EM. Each of the light emission control signal lines EM inputs the light emission control signal input from the light emission control signal line drive circuit 62 to the pixel circuit PX electrically connected to that light emission control signal line EM.

The data signal line drive circuit 63 is provided outside the display portion 2 and is electrically connected to the terminal portion 40 provided in the frame region DB of the display device 1. The plurality of data signal lines DL intersect each of the plurality of scanning signal lines SC and are disposed parallel to each other. One pixel circuit PX is provided at a position where one scanning signal line SC and one data signal line DL intersect in the display region DA. One end of each of the plurality of data signal lines DL is electrically connected to the terminal portion 40. The data signal line drive circuit 63 drives the plurality of data signal lines DL by inputting data signals to the plurality of data signal lines DL via the terminal portion 40. The data signal is an analog voltage signal corresponding to an image to be displayed on the display portion 2. Each of the data signal lines DL inputs the data signal input from the data signal line drive circuit 63 to the pixel circuit PX electrically connected to that data signal line DL.

The display device 1 further includes a first high power supply voltage trunk wiring line 81, a second high power supply voltage trunk wiring line 82, a third high power supply voltage trunk wiring line 83, a fourth high power supply voltage trunk wiring line 84, a plurality of high power supply voltage wiring lines VH, and a low power supply voltage trunk wiring line 90.

The first high power supply voltage trunk wiring line 81 is provided on the terminal portion 40 side in the frame region DB of the display portion 2 and branches into the plurality of high power supply voltage wiring lines VH. The first high power supply voltage trunk wiring line 81 extends in the Y-direction from one end side to the other end side of the display region DA in the Y-direction. One end of the first high power supply voltage trunk wiring line 81 is electrically connected to one end of the third high power supply voltage trunk wiring line 83, and the other end is electrically connected to one end of the fourth high power supply voltage trunk wiring line 84. A portion of the first high power supply voltage trunk wiring line 81 is formed in a slit of a flattening film 21 to be described later.

The second high power supply voltage trunk wiring line 82 is provided on a side opposite to the terminal portion 40 (the rolling mechanism 110 side) in the frame region DB of the display portion 2 and branches into the plurality of high power supply voltage wiring lines VH. The second high power supply voltage trunk wiring line 82 extends in the Y-direction from one end side to the other end side of the display region DA in the Y-direction. One end of the second high power supply voltage trunk wiring line 82 is electrically connected to the other end of the third high power supply voltage trunk wiring line 83, and the other end is electrically connected to the other end of the fourth high power supply voltage trunk wiring line 84.

The third high power supply voltage trunk wiring line 83 is provided on the scanning signal line drive circuit 61 side in the frame region DB of the display portion 2. The third high power supply voltage trunk wiring line 83 extends in the Z-direction from one end side to the other end side of the display region DA in the Z-direction. One end of the third high power supply voltage trunk wiring line 83 is electrically connected to one end of the first high power supply voltage trunk wiring line 81, and the other end is electrically connected to one end of the second high power supply voltage trunk wiring line 82.

The fourth high power supply voltage trunk wiring line 84 is provided on the light emission control signal line drive circuit 62 side in the frame region DB of the display portion 2. In other words, the fourth high power supply voltage trunk wiring line 84 is provided on a side opposite to the third high power supply voltage trunk wiring line 83 in the frame region DB of the display portion 2. The fourth high power supply voltage trunk wiring line 84 extends in the Z-direction from one end side to the other end side of the display region DA in the Z-direction. One end of the fourth high power supply voltage trunk wiring line 84 is electrically connected to the other end of the first high power supply voltage trunk wiring line 81, and the other end is electrically connected to the other end of the second high power supply voltage trunk wiring line 82.

As illustrated in FIG. 6, one high power supply voltage trunk wiring line consisting of the first high power supply voltage trunk wiring line 81, the second high power supply voltage trunk wiring line 82, the third high power supply voltage trunk wiring line 83, and the fourth high power supply voltage trunk wiring line 84 is provided in the frame region DB to surround the display region DA of the display portion 2.

The plurality of high power supply voltage wiring lines VH are disposed parallel to the plurality of data signal lines DL and parallel to each other. The plurality of high power supply voltage wiring lines VH correspond to the plurality of data signal lines DL on a one-to-one basis. Each of the high power supply voltage wiring lines VH is electrically connected to a single row of plurality of pixel circuits PX disposed in the Z-direction in the display region DA. One end of each of the plurality of high power supply voltage wiring lines VH is electrically connected to the first high power supply voltage trunk wiring line 81, and the other end is electrically connected to the second high power supply voltage trunk wiring line 82. In other words, the plurality of high power supply voltage wiring lines VH branch off from the first high power supply voltage trunk wiring line 81 and also branch off from the second high power supply voltage trunk wiring line 82.

The low power supply voltage trunk wiring line 90 is provided surrounding the display region DA in the frame region DB of the display portion 2. Both ends of the low power supply voltage trunk wiring line 90 are electrically connected to the terminal portion 40. The power source circuit 60 inputs a low power supply voltage VSS to the low power supply voltage trunk wiring line 90 through the terminal portion 40. As will be described in detail later, the low power supply voltage trunk wiring line 90 is electrically connected to a cathode 25 of the light-emitting element ES included in each pixel circuit PX. The low power supply voltage trunk wiring line 90 is a wiring line used for inputting the low power supply voltage VSS to the cathode 25.

Cross-sectional Configuration of Display Region DA

Figure 7:
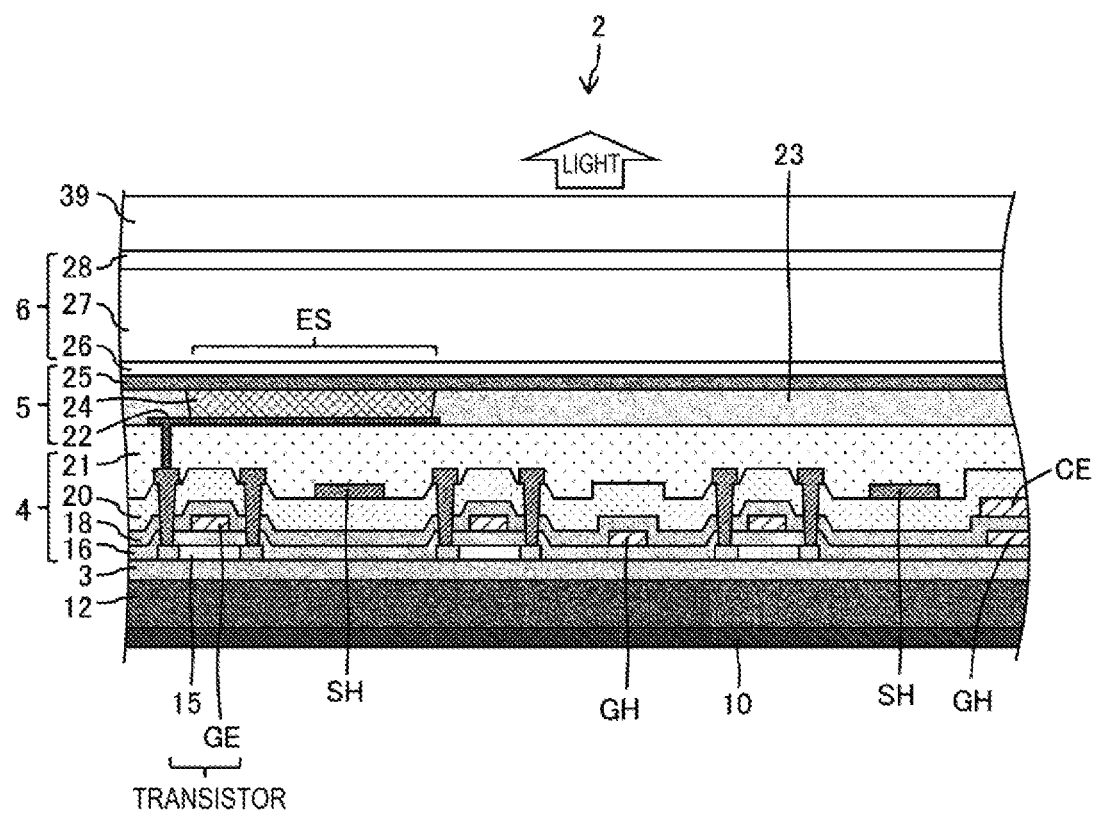
FIG. 7 is a cross-sectional view illustrating a configuration of a display region of the display portion.

FIG. 7 is a cross-sectional view illustrating a configuration of the display region DA of the display portion 2. Hereinafter, "the same layer" means that the layer in question is formed by the same process (film formation process), "a lower layer" means that the layer in question is formed in an earlier process than a comparison layer, and "an upper layer" means that the layer in question is formed in a later process than the comparison layer.

As illustrated in FIG. 7, the display portion 2 is a top-emitting display device that emits light upward, and includes a lower face film 10, a resin layer 12, a barrier layer 3 (base coat layer), a TFT layer 4, a light-emitting element layer 5, a sealing layer 6, and a function film 39 in the stated order from the bottom.

An example of the material of the resin layer 12 is a polyimide. A portion of the resin layer 12 can be replaced with two resin films (for example, polyimide films) and an inorganic insulating film interposed therebetween.

The barrier layer 3 is a layer that prevents foreign matter such as water and oxygen from infiltrating the TFT layer 4 and the light-emitting element layer 5, and can be constituted by a silicon oxide film, a silicon nitride film, or a silicon oxynitride film formed by a chemical vapor deposition (CVD) method, or may be a layered film formed by layering these films.

The TFT layer 4 includes a semiconductor film 15, an inorganic insulating film 16 (gate insulating film) which is an upper layer overlying the semiconductor film 15, a gate electrode GE and a gate wiring line GH which are upper layers overlying the inorganic insulating film 16, an inorganic insulating film 18 which is an upper layer overlying the gate electrode GE and the gate wiring line GH, a capacitance electrode CE which is an upper layer overlying the inorganic insulating film 18, an inorganic insulating film 20 which is an upper layer overlying the capacitance electrode CE, a source wiring line SH which is an upper layer overlying the inorganic insulating film 20, and the flattening film 21 (interlayer insulating film) which is an upper layer overlying the source wiring line SH.

The semiconductor film 15 is constituted by, for example, a low-temperature polysilicon (LTPS) or an oxide semiconductor (for example, an In—Ga—Zn—O-based semiconductor). A transistor (TFT) is configured to include the semiconductor film 15 and the gate electrode GE. FIG. 7 illustrates a transistor having a top gate structure, but the transistor may have a bottom gate structure.

Each of the gate electrode GE, the gate wiring line GH, the capacitance electrode CE, and the source wiring line SH is constituted by a single layer film or a layered film of a metal containing, for example, at least one of aluminum, tungsten, molybdenum, tantalum, chromium, titanium, and copper. A single semiconductor layer and three metal layers are included in the TFT layer 4 in FIG. 7.

Each of the inorganic insulating films 16, 18, and 20 can be constituted by a silicon oxide ($SiO_x$) film or a silicon nitride ($SiN_x$) film formed by, for example, a CVD method, or a layered film formed by layering these films. The flattening film 21 can be formed of, for example, a coatable organic material such as polyimide or acryl.

The light-emitting element layer 5 includes an anode 22 (first electrode) which is an upper layer overlying the flattening film 21, an insulating edge cover 23 that covers an edge of the anode 22, an electroluminescent (EL) layer 24 which is an upper layer overlying the edge cover 23, and the cathode 25 (second electrode) which is an upper layer overlying the EL layer 24. The edge cover 23 is formed by applying an organic material such as polyimide or acryl and then patterning the organic material by photolithography.

In each pixel circuit PX, the light-emitting element ES (for example, an organic light-emitting diode (OLED) or a quantum dot light-emitting diode (QLED)) including the island-shaped anode 22, the EL layer 24, and the cathode 25 is formed in the light-emitting element layer 5, and the pixel circuit PX controlling the light-emitting element ES is formed in the TFT layer 4.

The EL layer 24 (function layer) is interposed between the anode 22 and the cathode 25. For example, the EL layer 24 is configured by layering a hole injection layer, a hole transport layer, a light-emitting layer, an electron transport layer, and an electron injection layer in this order from the lower layer side. The light-emitting layer is formed in an island shape in an opening (for each subpixel) of the edge cover 23 by a vapor deposition method or an ink jet method. The other layers are formed in an island shape or a solid-like shape (common layer). A configuration is also possible in which one or more of the hole injection layer, the hole transport layer, the electron transport layer, and the electron injection layer are not formed.

In a case where the light-emitting layer of the OLED is formed by vapor deposition, a fine metal mask (FMM) is used. The FMM is a sheet (for example, a sheet made of an Invar material) having a large number of openings. The island-shaped light-emitting layer (corresponding to one subpixel) is formed of an organic material passing through one opening.

For a light-emitting layer of a QLED, an island-shaped light-emitting layer (corresponding to one subpixel) can be formed by performing inkjet coating with a solvent having quantum dots diffused therein, for example.

The anode 22 is constituted by layers of, for example, an indium tin oxide (ITO) and silver (Ag) or an alloy containing Ag, and has light reflectivity. The anode 22 is individually provided for each corresponding light-emitting element ES. The cathode 25 can be constituted by a light-transmitting conductive material such as an Mg—Ag alloy (extremely thin film), ITO, or indium zinc oxide (IZO). The cathode 25 is provided in common to the plurality of light-emitting elements ES.

In a case where the light-emitting element ES is an OLED, holes and electrons recombine inside the light-emitting layer in response to a drive current between the anode 22 and the cathode 25, and light is emitted during a process in which excitons generated due to the recombination transition to a ground state. Because the cathode 25 is transparent and the anode 22 reflects light, light emitted from the EL layer 24 travels upward and the display portion becomes top-emitting.

In a case where the light-emitting element ES is a QLED, holes and electrons recombine inside the light-emitting layer in response to a drive current between the anode 22 and the cathode 25, and light (fluorescent light) is emitted during a process in which excitons generated due to the recombination transition from a conduction band of quantum dots to a valence band of quantum dots.

A light-emitting element (an inorganic light-emitting diode or the like) other than the above-described OLED or QLED may be formed in the light-emitting element layer 5.

The sealing layer 6 is transparent and includes an inorganic sealing film 26 covering the cathode 25, an organic buffer film 27 which is an upper layer overlying the inorganic sealing film 26, and an inorganic sealing film 28 which is an upper layer overlying the organic buffer film 27. The sealing layer 6 covering the light-emitting element layer 5 prevents foreign matter such as water and oxygen from infiltrating the light-emitting element layer 5.

Both the inorganic sealing film 26 and the inorganic sealing film 28 are inorganic insulating films and can be constituted by a silicon oxide film, a silicon nitride film, or a silicon oxynitride film formed by, for example, a CVD method, or can be constituted by a layered film formed by layering these films. The organic buffer film 27 is a transparent organic film having a flattening effect and can be formed of a coatable organic material such as acryl. The organic buffer film 27 can be formed by, for example, ink jet coating, and a bank for stopping liquid droplets may be provided in the display region DA.

The lower face film 10 is, for example, a PET film used for imparting the display portion 2 with excellent flexibility by peeling off a support substrate and then bonding the support substrate to a lower surface of the resin layer 12. The function film 39 has at least one of, for example, an optical compensation function, a touch sensor function, and a protection function.

As illustrated in FIG. 6, a trench 91 is formed in the frame region DB of the display portion 2 surrounding the display region DA. The trench 91 is a portion where the flattening film 21 and the edge cover 23 in the frame region DB are partially open. The display device 1 further includes a conductive film 92 and a bank 93. The conductive film 92 is formed in the frame region DB of the display portion 2 overlapping at least the trench 91 and surrounding the display region DA. The conductive film 92 is formed in the same layer as the anode 22. In other words, the conductive film 92 is formed simultaneously with the anode 22 using the material of the anode 22. The conductive film 92 can also be referred to as a film formed by the anode 22. In the trench 91, the cathode 25 is electrically connected to the conductive film 92.

The conductive film 92 is formed into a solid shape between the trench 91 and the bank 93 in the same layer as the anode 22. The bank 93 is provided in the frame region DB of the display portion 2 overlapping at least the conductive film 92 and surrounding the display region DA. A slit (not illustrated) is formed between the bank 93 and the flattening film 21. In this slit, the conductive film 92 is electrically connected to a conductive layer (not illustrated) formed in the same layer as the source wiring line SH.

The low power supply voltage trunk wiring line 90 is formed in the same layer as the source wiring line SH in the frame region DB and is electrically connected to the conductive layer.

As described above, the cathode 25 is electrically connected to the conductive layer through the conductive film 92 in the frame region DB, and is further electrically connected to the terminal portion 40 via the low power supply voltage trunk wiring line 90. The power source circuit 60 can input the low power supply voltage VSS to the cathode 25 by inputting the low power supply voltage VSS to the low power supply voltage trunk wiring line 90 via the terminal portion 40.

The first high power supply voltage trunk wiring line 81, the second high power supply voltage trunk wiring line 82, the third high power supply voltage trunk wiring line 83, and the fourth high power supply voltage trunk wiring line 84 are all formed in the same layer as the source wiring line SH. A portion of each data signal line DL that overlaps the first high power supply voltage trunk wiring line 81 is formed in a different layer from the source wiring line SH (for example, the same layer as the gate wiring line GH). The first high power supply voltage trunk wiring line 81, the second high power supply voltage trunk wiring line 82, the third high power supply voltage trunk wiring line 83, and the fourth high power supply voltage trunk wiring line 84 are electrically connected to each other. The plurality of high power supply voltage wiring lines VH are electrically connected to the first high power supply voltage trunk wiring line 81 and the second high power supply voltage trunk wiring line 82. The first high power supply voltage trunk wiring line 81 is electrically connected to the terminal portion 40. The power source circuit 60 can input a high power supply voltage VDD, which is higher than the low power supply voltage VSS, to the plurality of high power supply voltage wiring lines VH by inputting the high power supply voltage VDD to the first high power supply voltage trunk wiring line 81 via the terminal portion 40.

As described above, the terminal portion 40 is a terminal configured to input the high power supply voltage VDD to the plurality of high power supply voltage wiring lines VH from outside the display device 1 and input the low power supply voltage VSS to the cathode 25.

Pixel Circuit PX

Figure 8:
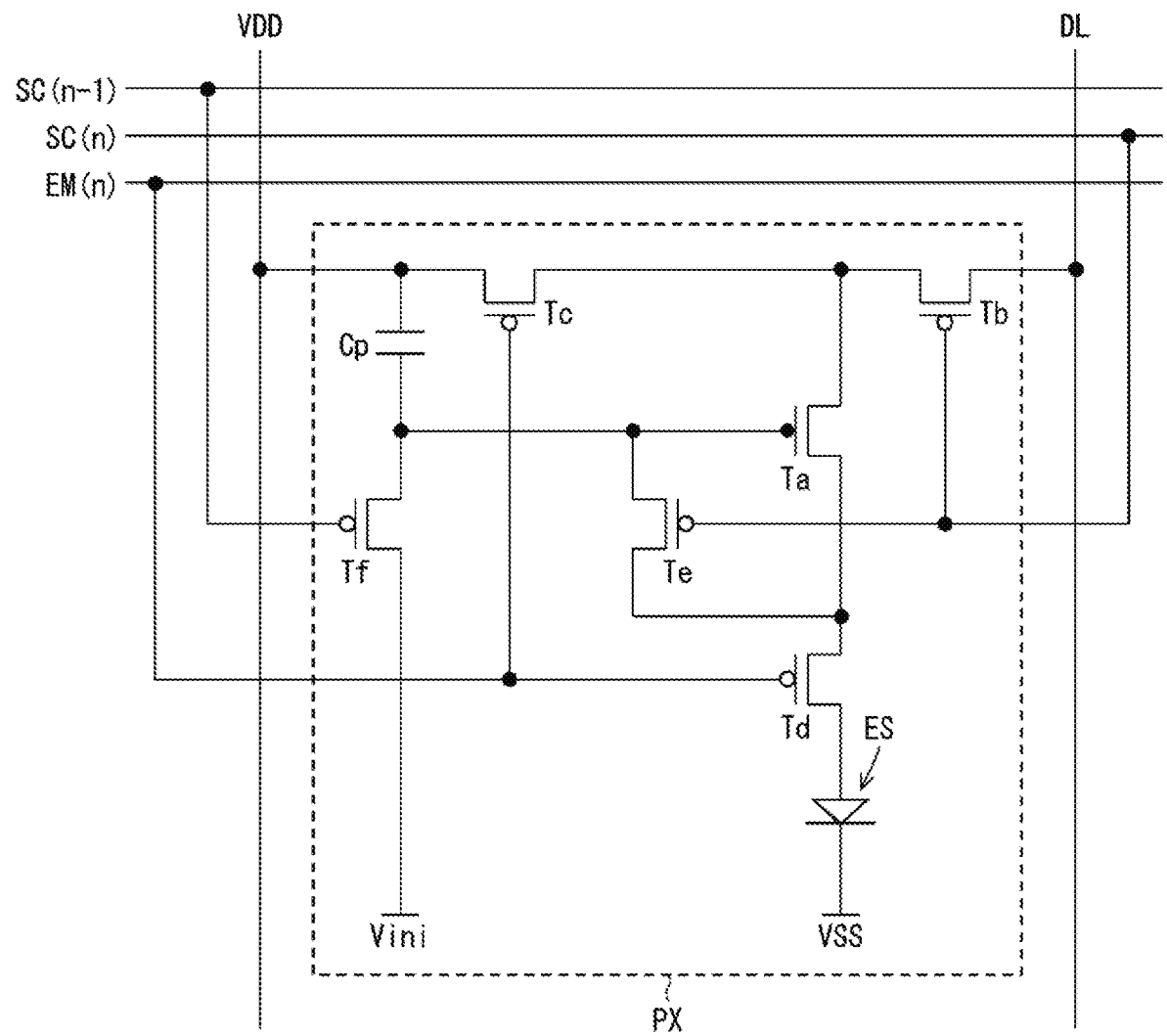
FIG. 8 is a circuit diagram illustrating a configuration example of a pixel circuit.

FIG. 8 is a circuit diagram illustrating a configuration example of the pixel circuit PX. The pixel circuit PX includes a drive transistor Ta, a switch transistor (write transistor) Tb, a power supply control transistor Tc, a light emission control transistor Td, a threshold voltage compensation transistor Te, an initialization transistor Tf, and an electrostatic capacitance Cp, which are formed in the TFT layer 4 illustrated in FIG. 7, and the light-emitting element ES (for example, an organic light-emitting diode) formed in the light-emitting element layer 5 illustrated in FIG. 7 and including the EL layer 24. All of the transistors Ta to Tf are examples of a thin film transistor.

A gate electrode of the drive transistor Ta is connected to a source electrode of the threshold voltage compensation transistor Te, a drain electrode of the initialization transistor Tf, and one capacitance electrode forming the electrostatic capacitance Cp. The drain electrode of the drive transistor Ta is connected to a source electrode of the switch transistor Tb and a source electrode of the power supply control transistor Tc. The source electrode of the drive transistor Ta is connected to a drain electrode of the light emission control transistor Td and a drain electrode of the threshold voltage compensation transistor Te.

A gate electrode of the switch transistor Tb is connected to an nth row scanning signal line GL(n), a drain electrode of the switch transistor Tb is connected to the data signal line DL, and a source electrode of the switch transistor Tb is connected to a drain electrode of the drive transistor Ta and the source electrode of the power supply control transistor Tc. A gate electrode of the power supply control transistor Tc is connected to an nth row light emission control signal line EM(n), a drain electrode of the power supply control transistor Tc is connected to one of the high power supply voltage wiring lines VH that is a supply line for the high power supply voltage VDD and the other capacitance electrode forming the electrostatic capacitance Cp, and a source electrode of the power supply control transistor Tc is connected to the drain electrode of the drive transistor Ta and the source electrode of the switch transistor Tb.

The anode 22 of the light-emitting element ES is electrically connected to the drain electrode of the light emission control transistor Td, and the cathode 25 of the light-emitting element ES is electrically connected to the low power supply voltage trunk wiring line 90 that is a supply line of the low power supply voltage VSS.

The high power supply voltage VDD and the low power supply voltage VSS used for driving the light-emitting element ES, and an initialization voltage Vini are input to each of the pixel circuits PX. In a period in which the scanning signal line SC(n) is activated, a data signal corresponding to display gray scale data is input from the data signal line DL to each of the pixel circuits PX connected thereto. Furthermore, in a period in which the light emission control signal line EM(n) is activated, the light-emitting element ES emits light at a brightness corresponding to the display gray scale data.

Figure 9:
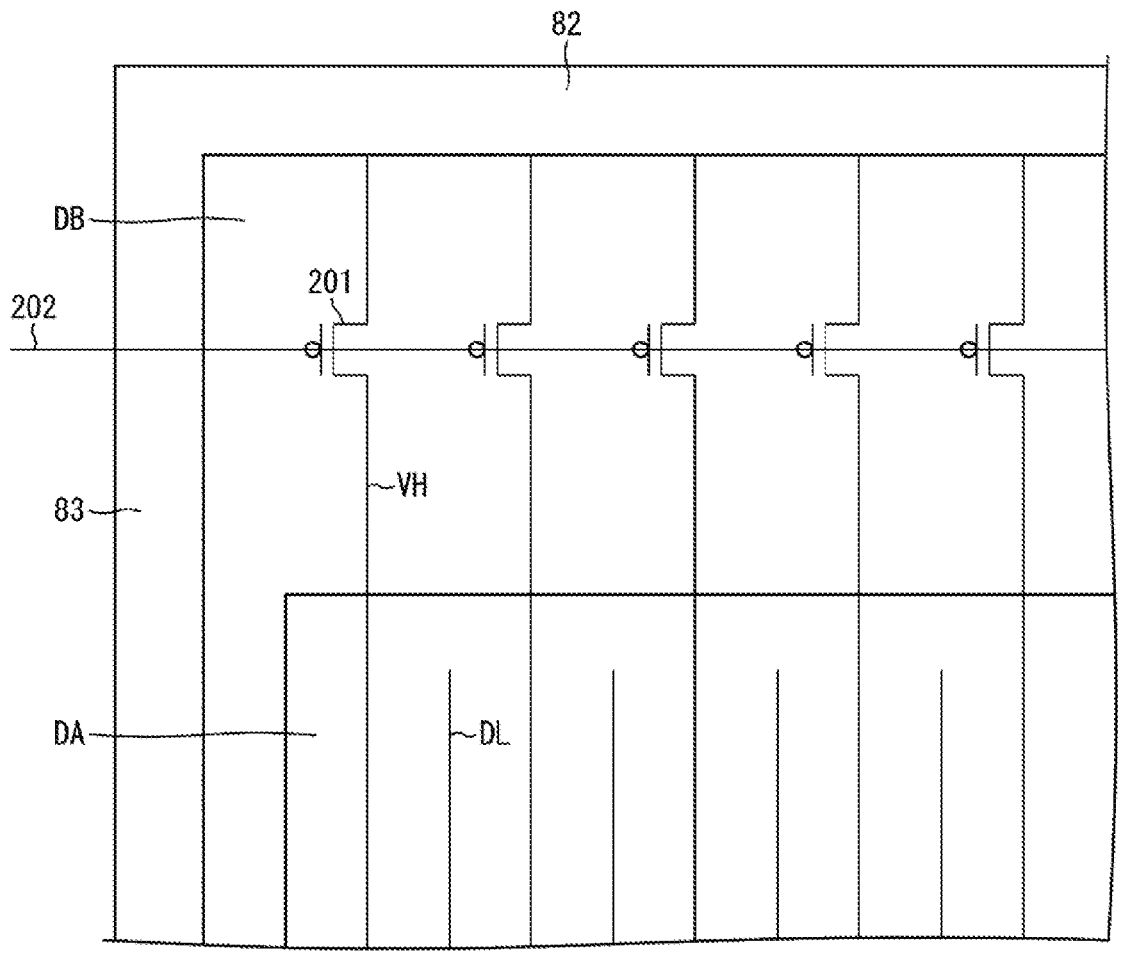
FIG. 9 is a diagram illustrating features of the display device according to the first embodiment.

FIG. 9 is a diagram illustrating features of the display device 1 according to the first embodiment. FIG. 9 is an enlarged view of the periphery of the second high power supply voltage trunk wiring line 82 in the display device 1. As illustrated in FIG. 9, the display device 1 further includes a plurality of switching elements 201 and a single high power supply voltage wiring line control signal line 202. The plurality of switching elements 201 are provided between the second high power supply voltage trunk wiring line 82 and the plurality of high power supply voltage wiring lines VH in the frame region DB. The plurality of switching elements 201 correspond to the plurality of high power supply voltage wiring lines VH on a one-to-one basis.

Each switching element 201 is a TFT formed in the TFT layer 4. A first conduction electrode (for example, a source electrode) of the switching element 201 is connected to the second high power supply voltage trunk wiring line 82, and a second conduction electrode (for example, a drain electrode) of the switching element 201 is connected to one end of a corresponding high power supply voltage wiring line VH. In this manner, each of the high power supply voltage wiring lines VH is connected to the second high power supply voltage trunk wiring line 82 via a corresponding switching element 201. The switching element 201 inputs the high power supply voltage VDD to the corresponding high power supply voltage wiring line VH.

One end of the high power supply voltage wiring line control signal line 202 is electrically connected to a high power supply voltage wiring line control circuit (not illustrated). The high power supply voltage wiring line control signal line 202 is connected in parallel with and in common to control terminals (gate electrodes) of the plurality of switching elements 201 in the frame region DB. The high power supply voltage wiring line control circuit can drive the high power supply voltage wiring line control signal line 202 by inputting a high power supply voltage wiring line control signal to the high power supply voltage wiring line control signal line 202.

As illustrated in FIG. 6, the plurality of position sensors 50 are regularly disposed in the display portion 2 in the Z-direction. An unrolled area and a rolled area can be detected based on detection results of the position sensors 50. For example, the display controller 151 may acquire the detection results of the position sensors 50 to perform such detection (determination).

For example, in a case where the position sensors 50 are optical sensors and one position sensor 50 detects light having an intensity of a predetermined value or greater, the position where the position sensor 50 is provided may be determined to be an unrolled area. On the other hand, in a case where one position sensor 50 detects light having an intensity less than a predetermined value, the position at which the position sensor 50 is provided may be determined to be a rolled area.

The display controller 151 determines whether the display region DA of the display portion 2 is completely removed from the rolling mechanism 110 on the basis of outputs from the plurality of position sensors 50. When the display controller 151 determines that at least a portion of the display region DA is accommodated in the rolling mechanism 110, the display controller 151 displays an image in the unrolled area of the display region DA and does not display an image in the rolled area of the display region DA. The display controller 151 further controls the high power supply voltage wiring line control circuit to input a high power supply voltage wiring line control signal at an off level from the high power supply voltage wiring line control circuit to the high power supply voltage wiring line control signal line 202. The high power supply voltage wiring line control signal at an off level is input to control terminals of each of the switching elements 201 so that the switching elements 201 are turned off. As a result, the high power supply voltage wiring lines VH are no longer electrically connected to the second high power supply voltage trunk wiring line 82, and thus the high power supply voltage VDD is not input from the second high power supply voltage trunk wiring line 82 to the high power supply voltage wiring lines VH. Thus, current does not flow to portions of the high power supply voltage wiring lines VH disposed in the rolled area of the display device 1. As a result, in the rolled area, Joule heat caused by a current flowing through the high power supply voltage wiring lines VH, the second high power supply voltage trunk wiring line 82, the third high power supply voltage trunk wiring line 83, and the fourth high power supply voltage trunk wiring line 84 can be prevented from being generated, and thus it is possible to prevent an increase in the temperature of the rolled area and deterioration of the display device 1.

Furthermore, the rolled area and the unrolled area of the display portion 2 are detected and, even when an image is displayed in only the unrolled area in the display region DA, provided that the plurality of high power supply voltage wiring lines VH are not electrically disconnected from the second high power supply voltage trunk wiring line 82 when turning off the plurality of switching elements 201 as in the present embodiment, a current flows to the second high power supply voltage trunk wiring line, the third high power supply voltage trunk wiring line, the fourth high power supply voltage trunk wiring line in the rolled area, and the high power supply voltage wiring lines VH in the rolled area, and thus heat is confined in the rolled area. Such heat generation can be prevented by the display device 1 according to the present embodiment.

In a case where the display controller 151 determines that the display region DA has been completely removed from the rolling mechanism 110, the display controller 151 controls the high power supply voltage wiring line control circuit to input a high power supply voltage wiring line control signal at an on level from the high power supply voltage wiring line control circuit to the high power supply voltage wiring line control signal line 202. The high power supply voltage wiring line control signal at an on level is input to the control terminals of each of the switching elements 201, and thus the switching elements 201 are turned on, and a current flows between the second high power supply voltage trunk wiring line 82 and the plurality of high power supply wiring voltage lines VH.

The display controller 151 controls the display portion 2 to display an image only in the unrolled area and not to display an image in the rolled area. More specifically, the display controller 151 may control the scanning signal line drive circuits 61, the light emission control signal line drive circuits 62, and the data signal line drive circuit 63 such that only the light-emitting element ES provided in the pixel circuit PX included in the unrolled area emits light (a drive current flows to only the light-emitting element ES).

With such control, it is possible to prevent the light-emitting element ES provided in the pixel circuit PX included in the rolled area from emitting light (prevent a drive current from flowing through the light-emitting element ES). For example, the display controller 151 may perform at least any one of the following types of control (1) to (3).

(1) The display controller 151 may control the scanning signal line drive circuits 61 to input a scanning signal to only a scanning signal line SC corresponding to a pixel circuit PX included in the unrolled area among the plurality of scanning signal lines SC. Thus, no scanning signal is input to a scanning signal line SC corresponding to a pixel circuit PX included in the rolled area among the plurality of scanning signal lines SC. Thus, an image can be displayed only in the unrolled area.

(2) The display controller 151 may control the light emission control signal line drive circuits 62 to input a light emission control signal to only a light emission control signal line EM corresponding to a pixel circuit PX included in the unrolled area among the plurality of light emission control signal lines EM. Thereby, no light emission control signal is input to a light emission control signal line EM corresponding to a pixel circuit PX included in the rolled area among the plurality of light emission control signal lines EM. Thus, an image can be displayed in only the unrolled area.

(3) The display controller 151 may control the data signal line drive circuit 63 to input a data signal to only a pixel circuit PX included in the unrolled area. Thereby, no data signal is input to a pixel circuit PX included in the rolled area. Thus, an image can be displayed in only the unrolled area.

As described above, the display controller 151 can determine the pixel circuit PX to which a signal is to be input among the plurality of pixel circuits PX on the basis of the detection results of the position sensors 50. Note that "signal" herein may be any signal. For example, the signal includes the data signal, the scanning signal, and the light emission control signal described above.

Figure 10:
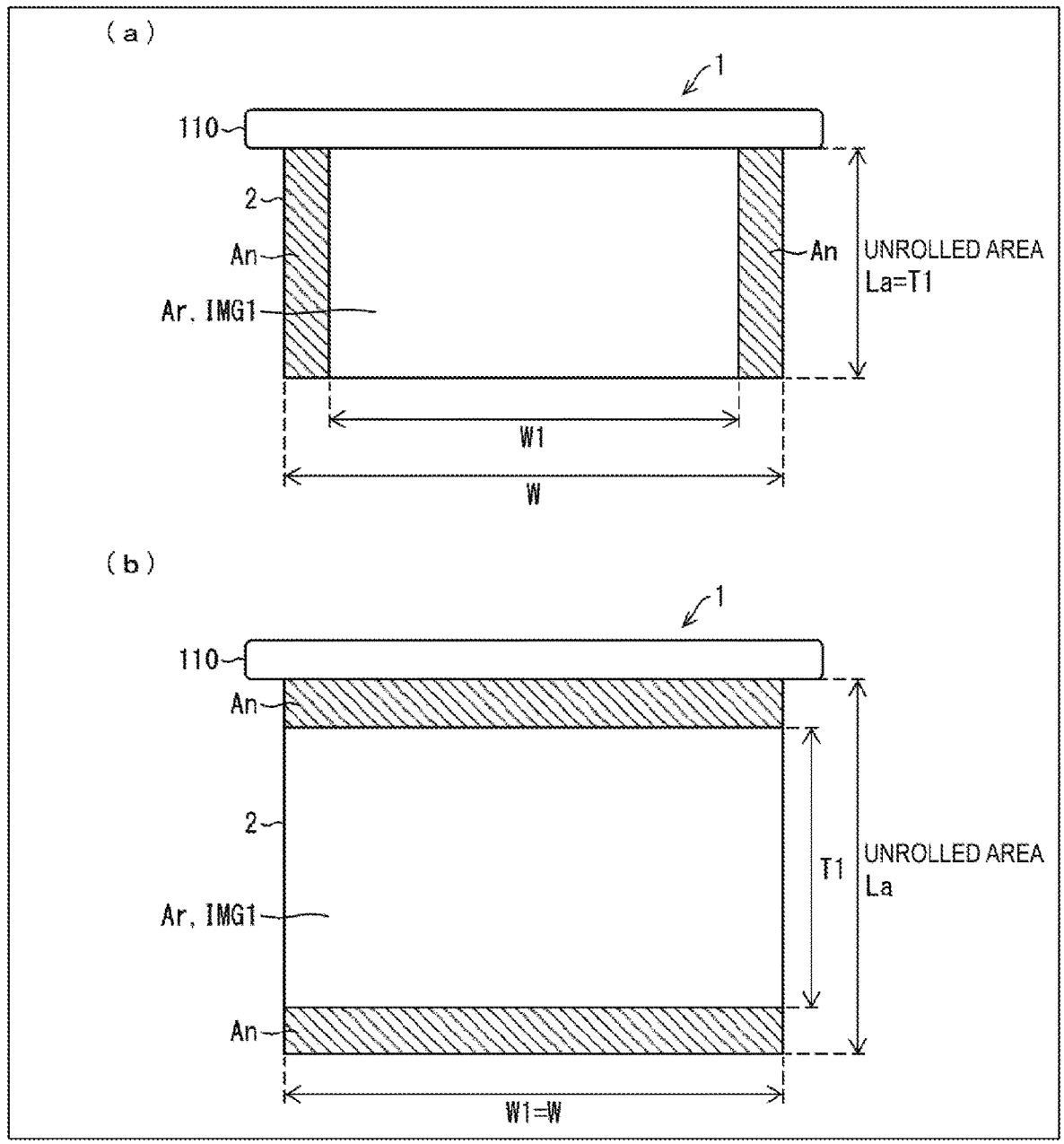
FIGS. 10(a) and 10(b) are diagrams illustrating an example of display control in the display device according to the first embodiment.

(a) and (b) of FIG. 10 are diagrams each illustrating an example of display control performed by the display controller 151. The display controller 151 may set a portion for displaying an image IMG1 (hereinafter, a display portion Ar) in the unrolled area on the basis of the length of the unrolled area and an aspect ratio of the image IMG1 to be displayed on the display portion 2. Note that a portion in which the image IMG1 is not displayed in the unrolled area is referred to as a non-display portion An.

As an example, a case where the aspect ratio of the image IMG1 is horizontal:vertical=16:9 will be considered. That is, when the length of the image IMG1 in the transverse direction is w1 and the length in the longitudinal direction is t1, w1:t1=16:9. The aspect ratio of the image IMG1 may be set to any ratio. Note that it is assumed that the longitudinal direction (vertical direction) and the transverse direction (horizontal direction) of the image IMG1 are set in advance.

Here, the length of the display portion 2 in the transverse direction is referred to as W1. As illustrated in (a) of FIG. 10, when the length La of the unrolled area is relatively short, the display controller 151 may set the display portion Ar in the entire unrolled area in the up-down direction. That is, the display controller 151 may display the image IMG1 on a reduced scale while maintaining the aspect ratio of the image IMG1. In this case, the length w1 of the image IMG1 in the transverse direction is set to be shorter than W1.

(a) of FIG. 10 illustrates a case where the display portion Ar is set at the center of the unrolled area in the transverse direction, and the non-display portion An is set at both ends of the unrolled area (portions excluding the display portion Ar from the unrolled area) in the transverse direction. The position where the display portion Ar is set is arbitrary. For example, in (a) of FIG. 10, the display portion Ar may be set to be in contact with a left end or a right end of the unrolled area.

As illustrated in (b) of FIG. 10, when the length La of the unrolled area is relatively long, the display controller 151 may set the length w1 of the image IMG1 in the transverse direction to be equal to W1 while maintaining the aspect ratio of the image IMG1. In this case, the length t1 of the image IMG1 in the longitudinal direction may be set to be shorter than the length La of the unrolled area.

(b) of FIG. 10 illustrates a case where the display portion Ar is set at the center of the unrolled area in a longitudinal direction, and the non-display portion An is set at both ends of the unrolled area in the longitudinal direction (portions excluding the display portion Ar from the unrolled area). Here, as described above, the display portion Ar may be set to be in contact with an upper edge or a lower edge of the unrolled area.

Because the display portion Ar is set as described above, the display of the image IMG1 can be changed while maintaining the aspect ratio of the IMG1 in accordance with the length of the unrolled area, and thus display quality for a user can be improved.

The display device 1 according to the present embodiment can be implemented as a display device 1 including the display portion 2 on only one side.

Second Embodiment

Figure 11:
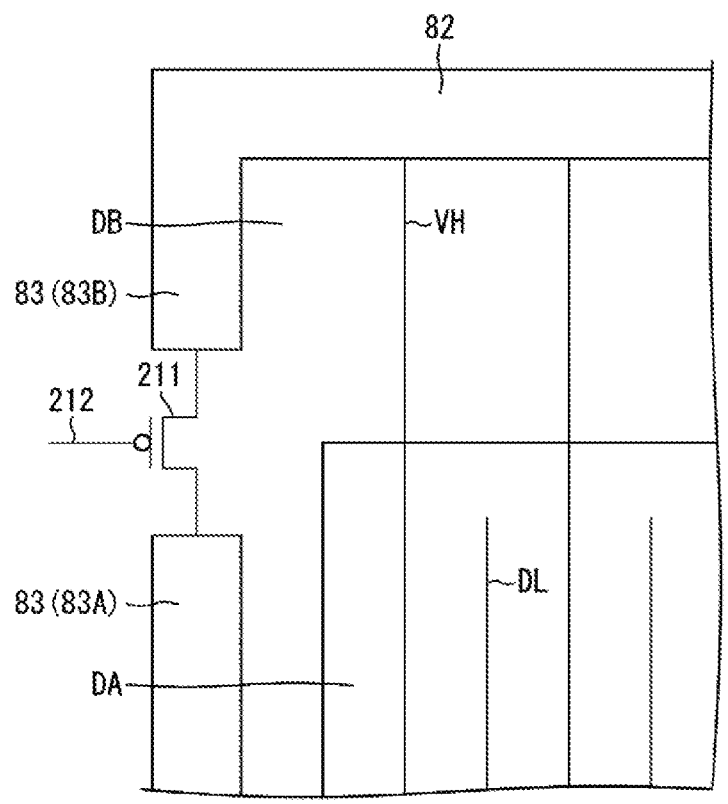
FIG. 11 is a diagram illustrating features of a display device according to a second embodiment.

FIG. 11 is a diagram illustrating features of a display device 1 according to a second embodiment. FIG. 11 is an enlarged view of the periphery of the third high power supply voltage trunk wiring line 83 in the display device 1 according to the second embodiment. The structure of the display device 1 according to the second embodiment is basically the same as the structure of the display device 1 according to the first embodiment illustrated in FIG. 6.

As illustrated in FIG. 11, the display device 1 further includes a first switching element 211 and a single first high power supply voltage wiring line control signal line 212. The first switching element 211 is provided at any position in the third high power supply voltage trunk wiring line 83. Specifically, the first switching element 211 is provided between a first portion 83A of the third high power supply voltage trunk wiring line 83 and a second portion 83B of the third high power supply voltage trunk wiring line 83 to connect the first portion 83A and the second portion 83B to each other. One end of the first portion 83A is electrically connected to one end of the first high power supply voltage trunk wiring line 81. The other end of the first portion 83A is electrically connected to a first conduction electrode (for example, a source electrode) of the first switching element 211. One end of the second portion 83B is electrically connected to a second conduction electrode (for example, a drain electrode) of the first switching element 211. The other end of the second portion 83B is electrically connected to one end of the second high power supply voltage trunk wiring line 82. Thus, in the present embodiment, the first high power supply voltage trunk wiring line 81 and the second high power supply voltage trunk wiring line 82 are connected to each other via the first switching element 211.

One end of the first high power supply voltage wiring line control signal line 212 is connected to a high power supply voltage wiring line control circuit (not illustrated). The other end of the first high power supply voltage wiring line control signal line 212 is electrically connected to a control terminal (gate electrode) of the first switching element 211. The high power supply voltage wiring line control circuit drives the first high power supply voltage wiring line control signal line 212 by inputting a high power supply voltage wiring line control signal to the first high power supply voltage wiring line control signal line 212.

The number of first switching elements 211 provided in the third high power supply voltage trunk wiring line 83 may be one or two or more.

Figure 12:
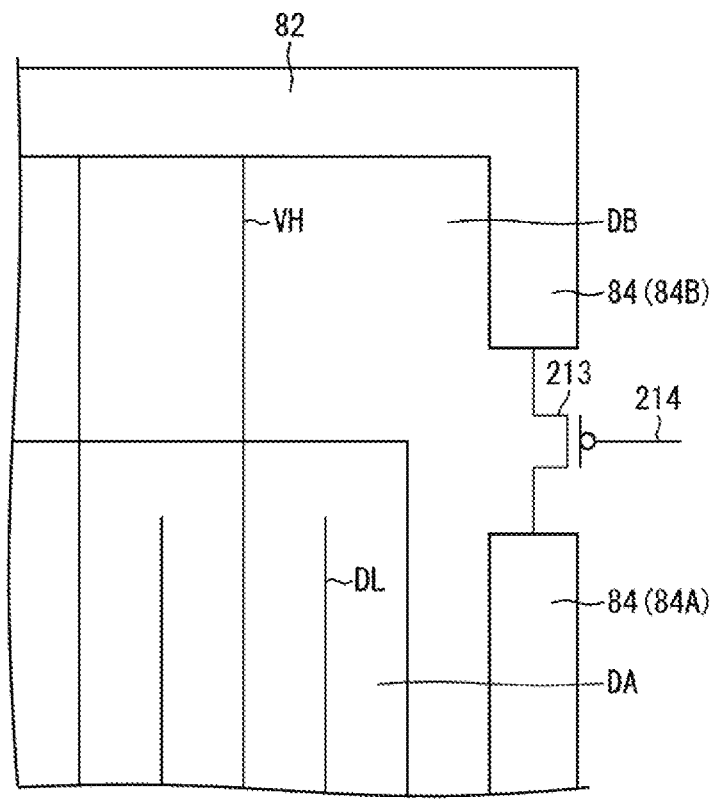
FIG. 12 is a diagram illustrating features of the display device according to the second embodiment.

FIG. 12 is a diagram illustrating features of the display device 1 according to the second embodiment. FIG. 12 is an enlarged view of the periphery of the fourth high power supply voltage trunk wiring line 84 in the display device 1. As illustrated in FIG. 12, the display device 1 further includes a second switching element 213 and a single second high power supply voltage wiring line control signal line 214. The second switching element 213 is provided at any position in the fourth high power supply voltage trunk wiring line 84. More specifically, the second switching element 213 is provided between a first portion 84A of the fourth high power supply voltage trunk wiring line 84 and a second portion 84B of the fourth high power supply voltage trunk wiring line 84 to connect the first portion 84A and the second portion 84B to each other. One end of the first portion 84A is electrically connected to the other end of the first high power supply voltage trunk wiring line 81. The other end of the first portion 84A is electrically connected to a first conduction electrode (for example, a source electrode) of the second switching element 213. One end of the second portion 84B is connected to a second conduction electrode (for example, a drain electrode) of the second switching element 213. The other end of the second portion 84B is electrically connected to the other end of the second high power supply voltage trunk wiring line 82. In this manner, in the present embodiment, the first high power supply voltage trunk wiring line 81 and the second high power supply voltage trunk wiring line 82 are connected to each other via the second switching element 213.

One end of the second high power supply voltage wiring line control signal line 214 is connected to a high power supply voltage wiring line control circuit (not illustrated). The other end of the second high power supply voltage wiring line control signal line 214 is electrically connected to a control terminal (gate electrode) of the second switching element 213. The high power supply voltage wiring line control circuit drives the second high power supply voltage wiring line control signal line 214 by inputting a high power supply voltage wiring line control signal to the second high power supply voltage wiring line control signal line 214.

The power source circuit 60 inputs the high power supply voltage VDD to the first high power supply voltage trunk wiring line 81 via the terminal portion 40. The high power supply voltage VDD is input from the first high power supply voltage trunk wiring line 81 to the third high power supply voltage trunk wiring line 83 and the fourth high power supply voltage trunk wiring line 84. In a case where the first switching element 211 is turned on, the first switching element 211 inputs the high power supply voltage VDD from the third high power supply voltage trunk wiring line 83 to the second high power supply voltage trunk wiring line 82. In a case where the second switching element 213 is turned on, the second switching element 213 inputs the high power supply voltage VDD from the third high power supply voltage trunk wiring line 83 to the second high power supply voltage trunk wiring line 82.

The display controller 151 determines whether the display region DA of the display portion 2 has been completely removed from the rolling mechanism 110 on the basis of outputs from the plurality of position sensors 50. In a case where the display controller 151 determines that at least a portion of the display region DA is accommodated in the rolling mechanism 110, the display controller 151 displays an image in the unrolled area of the display region DA and does not display an image in the rolled area of the display region DA. The display controller 151 further controls a high power supply voltage wiring line control circuit to input a high power supply voltage wiring line control signal at an off level from the high power supply voltage wiring line control circuit to the first high power supply voltage wiring line control signal line 212 and the second high power supply voltage wiring line control signal line 214. The high power supply voltage wiring line control signal at an off level is input to the first switching element 211 and the second switching element 213, and thus the first switching element 211 and the second switching element 213 are turned off. As a result, the third high power supply voltage trunk wiring line 83 and the second high power supply voltage trunk wiring line 82 are no longer electrically connected to each other, and thus the high power supply voltage VDD is not input from the third high power supply voltage trunk wiring line 83 to the second high power supply voltage trunk wiring line 82. Furthermore, the fourth high power supply voltage trunk wiring line 84 and the second high power supply voltage trunk wiring line 82 are no longer electrically connected to each other, and thus the high power supply voltage VDD is not input from the fourth high power supply voltage trunk wiring line 84 to the second high power supply voltage trunk wiring line 82. As a result, the high power supply voltage VDD is not input from the second high power supply voltage trunk wiring line 82 to the high power supply voltage wiring lines VH. Thus, current does not flow to portions of the high power supply voltage wiring lines VH disposed in the rolled area of the display device 1. As a result, in the rolled area, Joule heat caused by a current flowing through the high power supply voltage wiring lines VH, the second high power supply voltage trunk wiring line 82, the third high power supply voltage trunk wiring line 83, and the fourth high power supply voltage trunk wiring line 84 can be prevented from being generated, and thus it is possible to prevent an increase in the temperature of the rolled area and deterioration of the display device 1.

Furthermore, the rolled area and the unrolled area of the display portion 2 are detected and, even when an image is displayed in only the unrolled area in the display region DA, provided that the plurality of high power supply voltage wiring lines VH are not electrically disconnected from the third high power supply voltage trunk wiring line 83 and the fourth high power supply voltage trunk wiring line 84 when turning off the first switching element 211 and the second switching element 213 as in the present embodiment, a current flows to the second high power supply voltage trunk wiring line, the third high power supply voltage trunk wiring line, the fourth high power supply voltage trunk wiring line in the rolled area, and the high power supply voltage wiring lines VH in the rolled area, and thus heat is confined in the rolled area. Such heat generation can be prevented by the display device 1 according to the present embodiment.

In a case where the display controller 151 determines that the display region DA has been completely removed from the rolling mechanism 110, the display controller 151 controls the scanning signal line drive circuits 61 to input a high power supply voltage wiring line control signal at an on level from the scanning signal line drive circuits 61 to the first high power supply voltage wiring line control signal line 212 and the second high power supply voltage wiring line control signal line 214. The high power supply voltage wiring line control signal at an on level is input to a control terminal of the first switching element 211 and a control terminal of the second switching element 213, and thus both the first switching element 211 and the second switching element 213 are turned on. As a result, the third high power supply voltage trunk wiring line 83 and the second high power supply voltage trunk wiring line 82 are electrically connected to each other, and thus the high power supply voltage VDD is input from the third high power supply voltage trunk wiring line 83 to the second high power supply voltage trunk wiring line 82. Further, the fourth high power supply voltage trunk wiring line 84 and the second high power supply voltage trunk wiring line 82 are electrically connected to each other, and thus the high power supply voltage VDD is input from the fourth high power supply voltage trunk wiring line 84 to the second high power supply voltage trunk wiring line 82. The high power supply voltage VDD input to the second high power supply voltage trunk wiring line 82 is input to the high power supply voltage wiring lines VH, and consequently, a current flows between the second high power supply voltage trunk wiring line 82 and the plurality of high power supply voltage wiring lines VH.

The display device 1 according to the present embodiment can also be implemented as a display device 1 including the display portion 2 on only one side.

Third Embodiment

Figure 13:
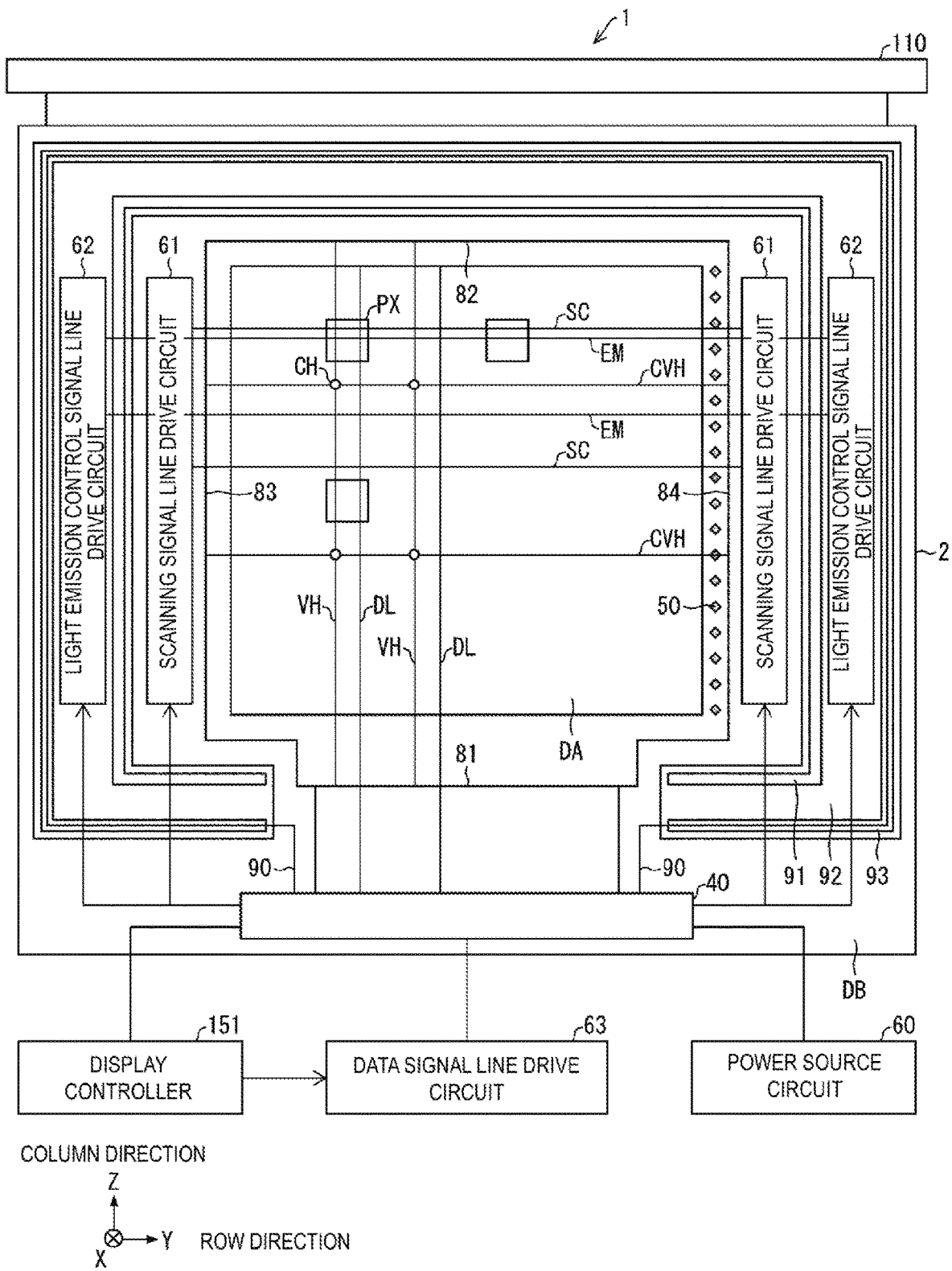
FIG. 13 is a plan view illustrating a detailed configuration of a display device according to a third embodiment.

FIG. 13 is a plan view illustrating a detailed configuration of a display device 1 according to a third embodiment. The display device 1 according to the present embodiment basically includes the same members as in the display device 1 according to the first embodiment illustrated in FIG. 6. As illustrated in FIG. 13, the display device 1 according to the present embodiment further includes a plurality of intersecting high power supply voltage wiring lines CVH.

The plurality of intersecting high power supply voltage wiring lines CVH and the plurality of high power supply voltage wiring lines VH intersect each other and are disposed in parallel with each other. Contact holes CH are formed at intersections between each of the intersecting high power supply voltage wiring lines CVH and each of the high power supply voltage wiring lines VH. Each of the intersecting high power supply voltage wiring lines CVH and each of the high power supply voltage wiring lines VH are electrically connected to each other at the corresponding contact hole CH. The plurality of intersecting high power supply voltage wiring lines CVH are formed in the same layer as the gate wiring line GH or in the same layer as the capacitance electrode CE. One end of each of the plurality of intersecting high power supply voltage wiring lines CVH is electrically connected to the third high power supply voltage trunk wiring line 83, and the other end is electrically connected to the fourth high power supply voltage trunk wiring line 84. In other words, the third high power supply voltage trunk wiring line 83 and the fourth high power supply voltage trunk wiring line 84 branch into the plurality of intersecting high power supply voltage wiring lines CVH.

Figure 14:
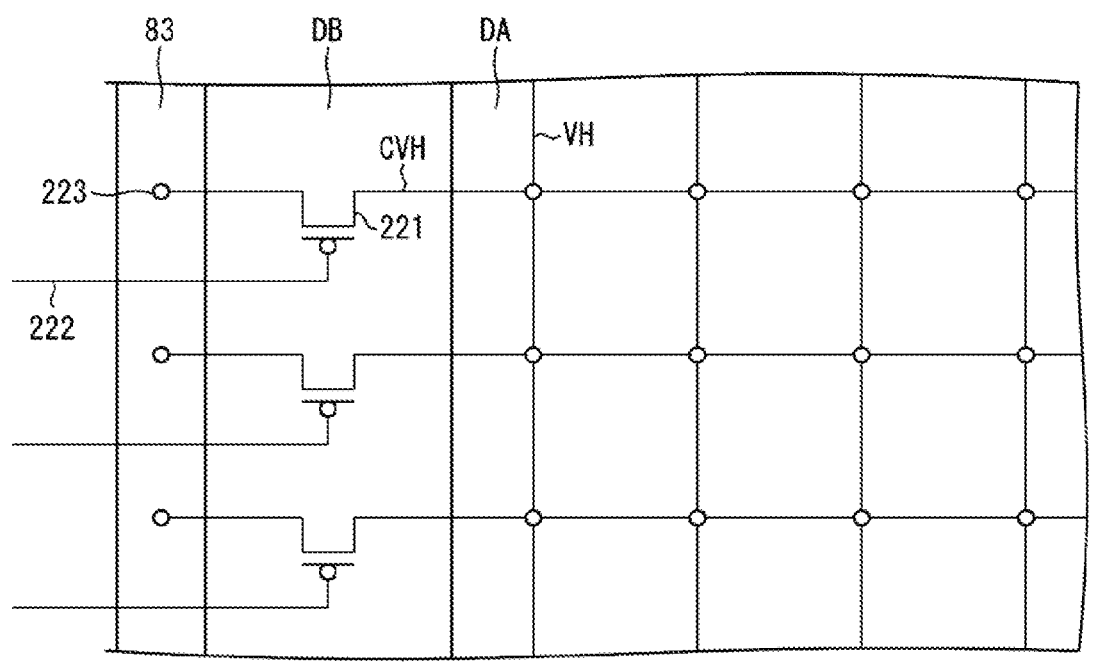
FIG. 14 is a diagram illustrating features of the display device according to the third embodiment.

FIG. 14 is a diagram illustrating features of the display device 1 according to the third embodiment. FIG. 14 is an enlarged view of the periphery of the third high power supply voltage trunk wiring line 83 in the display device 1. As illustrated in FIG. 14, the display device 1 further includes a plurality of first switching elements 221 and a plurality of first high power supply voltage wiring line control signal lines 222. The plurality of first switching elements 221 are provided between the third high power supply voltage trunk wiring line 83 and the plurality of intersecting high power supply voltage wiring lines CVH. The plurality of first high power supply voltage wiring line control signal lines 222 correspond to the plurality of first switching elements 221 on a one-to-one basis. The plurality of first high power supply voltage wiring line control signal lines 222 further correspond to the plurality of light emission control signal lines EM on a one-to-one basis.

A plurality of contact holes 223 are formed overlapping the third high power supply voltage trunk wiring line 83. The plurality of contact holes 223 correspond to the plurality of first switching elements 221 on a one-to-one basis. A first conduction electrode (for example, a source electrode) of each of the first switching elements 221 is electrically connected to the third high power supply voltage trunk wiring line 83 through the corresponding contact hole 223. A second conduction electrode (for example, a drain electrode) of each of the first switching elements 221 is electrically connected to one end of the corresponding intersecting high power supply voltage wiring line CVH.

One end of each of the first high power supply voltage wiring line control signal lines 222 is electrically connected to, for example, the corresponding light emission control signal line EM. The other end of each of the first high power supply voltage wiring line control signal lines 212 is electrically connected to a control terminal (gate electrode) of the corresponding first switching element 221. The light emission control signal line drive circuits 62 can also drive the plurality of first high power supply voltage wiring line control signal lines 222 by inputting light emission control signals to the plurality of first high power supply voltage wiring line control signal lines 222. Each of the first high power supply voltage wiring line control signal lines 222 may be electrically connected to a high power supply voltage wiring line control circuit (not illustrated) included in the display device 1 separately from the scanning signal line drive circuits 61. In this case, the high power supply voltage wiring line control circuit drives the plurality of first high power supply voltage wiring line control signal lines 222 by inputting a high power supply voltage wiring line control signal to the plurality of first high power supply voltage wiring line control signal lines 222.

Figure 15:
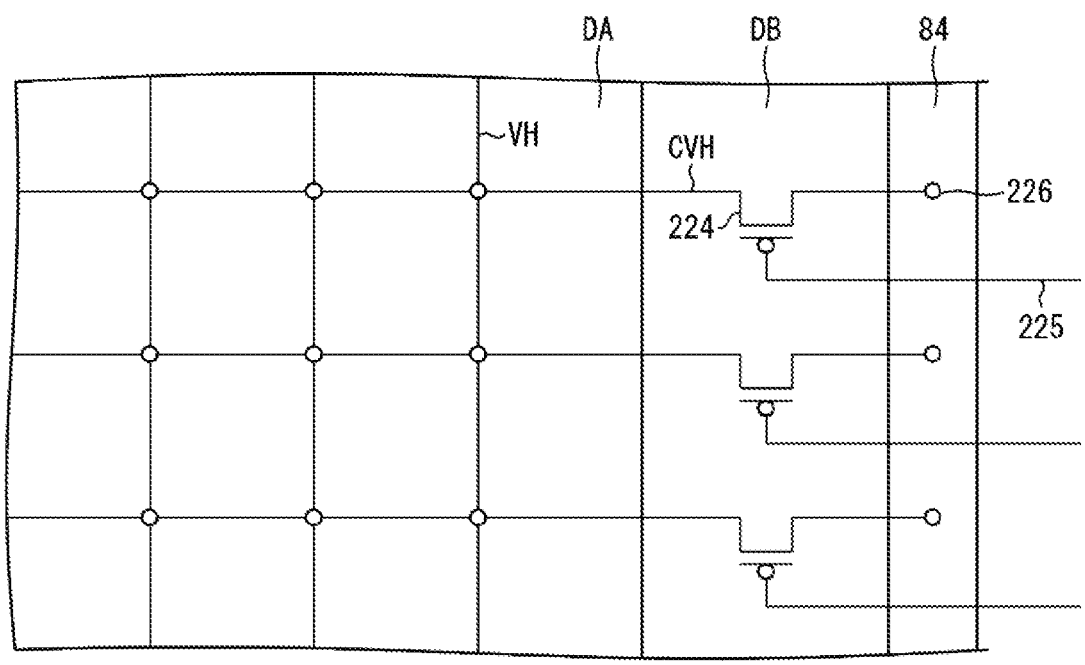
FIG. 15 is a diagram illustrating features of the display device according to the third embodiment.

FIG. 15 is a diagram illustrating features of a display device 1 according to a third embodiment. FIG. 15 is an enlarged view of the periphery of the fourth high power supply voltage trunk wiring line 84 in the display device 1. As illustrated in FIG. 15, the display device 1 further includes a plurality of second switching elements 224 and a plurality of second high power supply voltage wiring line control signal lines 225. The plurality of second switching elements 224 are provided between the fourth high power supply voltage trunk wiring line 84 and the plurality of intersecting high power supply voltage wiring lines CVH. The plurality of second high power supply voltage wiring line control signal lines 225 correspond to the plurality of second switching elements 224 on a one-to-one basis. The plurality of second high power supply voltage wiring line control signal lines 225 further correspond to the plurality of light emission control signal lines EM on a one-to-one basis.

A plurality of contact holes 226 are formed overlapping the fourth high power supply voltage trunk wiring line 84. The plurality of contact holes 226 correspond to the plurality of second switching elements 224 on a one-to-one basis. A first conduction electrode (for example, a source electrode) of each of the second switching elements 224 is electrically connected to the fourth high power supply voltage trunk wiring line 84 through the corresponding contact hole 227. A second conduction electrode (for example, a drain electrode) of each of the second switching elements 224 is electrically connected to the other end of the corresponding intersecting high power supply voltage wiring line CVH.

One end of each of the second high power supply voltage wiring line control signal lines 225 is electrically connected to, for example, the corresponding light emission control signal line EM. The other end of each of the second high power supply voltage wiring line control signal lines 225 is electrically connected to a control terminal (gate electrode) of the corresponding second switching element 224. The light emission control signal line drive circuits 62 can also drive the plurality of second high power supply voltage wiring line control signal lines 225 by inputting light emission control signals to the plurality of second high power supply voltage wiring line control signal lines 225.

The light emission control signal line drive circuits 62 are devised such that, rather than sequentially inputting a light emission control signal to each light emission control signal line EM through simple shift register input control, a light emission control signal at an on level is not input to the light emission control signal lines EM disposed in the rolled area. More specifically, the display controller 151 controls the light emission control signal line drive circuits 62 so as to input a light emission control signal at an off level to the light emission control signal lines EM disposed in the rolled area and input a light emission control signal at an on level to the light emission control signal lines EM disposed in the unrolled area among the plurality of light emission control signal lines EM. Thereby, only the second switching elements 224 disposed in the unrolled area are turned on while the first switching elements 221 disposed in the rolled area are maintained in an off state. As a result, the high power supply voltage VDD is input to each of the intersecting high power supply voltage wiring lines CVH disposed in the unrolled area, and thus a current flows to the unrolled area. Further, the high power supply voltage VDD is not input to the intersecting high power supply voltage wiring lines CVH disposed in the rolled area, and thus a current does not flow to the rolled area. Thus, it is possible to prevent an increase in the temperature of the rolled area and deterioration of the display device 1.

The second high power supply voltage wiring line control signal lines 225 may be connected to a high power supply voltage wiring line control circuit (not illustrated) provided separately from the light emission control signal line drive circuits 62. In this case, the high power supply voltage wiring line control circuit drives the plurality of second high power supply voltage wiring line control signal lines 225 by inputting a high power supply voltage wiring line control signal to the plurality of second high power supply voltage wiring line control signal lines 225.

The power source circuit 60 inputs the high power supply voltage VDD to the first high power supply voltage trunk wiring line 81 via the terminal portion 40. The high power supply voltage VDD is input from the first high power supply voltage trunk wiring line 81 to the third high power supply voltage trunk wiring line 83 and the fourth high power supply voltage trunk wiring line 84. In a case where each of the first switching elements 221 is turned on, each first switching element 221 inputs the high power supply voltage VDD to the corresponding intersecting high power supply voltage wiring line CVH from the third high power supply voltage trunk wiring line 83. In a case where each of the second switching elements 224 is turned on, each second switching element 224 inputs the high power supply voltage VDD to the corresponding intersecting high power supply voltage wiring line CVH from the fourth high power supply voltage trunk wiring line 84.

The display controller 151 determines whether the display region DA of the display portion 2 has been completely removed from the rolling mechanism 110 on the basis of outputs from the plurality of position sensors 50. In a case where the display controller 151 determines that at least a portion of the display region DA is accommodated in the rolling mechanism 110, the display controller 151 displays an image in the unrolled area of the display region DA and does not display an image in the rolled area of the display region DA. The display controller 151 further controls the light emission control signal line drive circuits 62 so as to input a high power supply voltage wiring line control signal at an off level to the first high power supply voltage wiring line control signal lines 222 and the second high power supply voltage wiring line control signal lines 225 disposed in the rolled area. The high power supply voltage wiring line control signal at an off level is input to the first switching elements 221 and the second switching elements 224, and thus the first switching elements 221 and the second switching elements 224 are turned off. As a result, the third high power supply voltage trunk wiring line 83 and the intersecting high power supply voltage wiring lines CVH disposed in the rolled area are no longer electrically connected to each other, and thus the high power supply voltage VDD is not input to the intersecting high power supply voltage wiring lines CVH disposed in the rolled area from the third high power supply voltage trunk wiring line 83. Further, the fourth high power supply voltage trunk wiring line 84 and the intersecting high power supply voltage wiring lines CVH disposed in the rolled area are no longer electrically connected to each other, and thus the high power supply voltage VDD is not input to the intersecting high power supply voltage wiring lines CVH disposed in the rolled area from the fourth high power supply voltage trunk wiring line 84. Thus, current does not flow to the intersecting high power supply voltage wiring lines CVH disposed in the rolled area of the display device 1. As a result, in the rolled area, Joule heat caused by a current flowing through the intersecting high power supply voltage wiring lines CVH, the second high power supply voltage trunk wiring line 82, the third high power supply voltage trunk wiring line 83, and the fourth high power supply voltage trunk wiring line 84 can be prevented from being generated, and thus it is possible to prevent an increase in the temperature of the rolled area and deterioration of the display device 1.

Furthermore, the rolled area and the unrolled area of the display portion 2 are detected and, even when an image is displayed in only the unrolled area in the display region DA, provided that the plurality of intersecting high power supply voltage wiring lines CVH disposed in the rolled area are not electrically disconnected from the third high power supply voltage trunk wiring line 83 and the fourth high power supply voltage trunk wiring line 84 when turning off the first switching elements 221 and the second switching elements 224 corresponding to the rolled area as in the present embodiment, a current flows to the second high power supply voltage trunk wiring line, the third high power supply voltage trunk wiring line, and the fourth high power supply voltage trunk wiring line, and the fourth high power supply voltage trunk wiring line in the rolled area, and the intersecting high power supply voltage wiring lines CVH disposed in the rolled area, and thus heat is confined in the rolled area. Such heat generation can be prevented by the display device 1 according to the present embodiment.

In a case where the display controller 151 determines that the display region DA has been completely removed from the rolling mechanism 110, the display controller 151 controls the light emission control signal line drive circuits 62 to input a light emission control signal at an on level to the first high power supply voltage wiring line control signal lines 222 and the second high power supply voltage wiring line control signal lines 225. The light emission control signal at an on level is input to the first switching elements 221 and the second switching elements 224, and thus the first switching elements 221 and the second switching elements 224 are turned on. As a result, the third high power supply voltage trunk wiring line 83 and the intersecting high power supply voltage wiring lines CVH are electrically connected to each other, and thus the high power supply voltage VDD is input to the intersecting high power supply voltage wiring lines CVH from the third high power supply voltage trunk wiring line 83. Further, the fourth high power supply voltage trunk wiring line 84 and the intersecting high power supply voltage wiring lines CVH are electrically connected to each other, and thus the high power supply voltage VDD is input to the intersecting high power supply voltage wiring lines CVH from the fourth high power supply voltage trunk wiring line 84. Thus, a current flows between the third high power supply voltage trunk wiring line 83 and the plurality of intersecting high power supply voltage wiring lines CVH, and a current also flows between the fourth high power supply voltage trunk wiring line 84 and the plurality of intersecting high power supply voltage wiring lines CVH.

The display device 1 according to the present embodiment can also be implemented as a display device 1 including the display portion 2 on only one side.

Note that the first to third embodiments may be combined with each other.

The disclosure has been described by adopting an example of an organic EL having a configuration in which a positive electrode, a light-emitting layer, and a negative electrode are provided in this order from a substrate, but an organic EL having a configuration in which a negative electrode, a light-emitting layer, and a positive electrode are provided in this order from a substrate may be used. In this configuration, high power supply voltage wiring lines and the like are low power supply voltage wiring lines and the like, and the above-described embodiments can be similarly applied to this configuration.

Implementation with Software

Control blocks (in particular, the controller 150) of the display device 1 may be implemented by a logic circuit (hardware) formed in an integrated circuit (IC chip) or the like, or may be implemented by software using a central processing unit (CPU).

In the latter case, the display device 1 includes a CPU that executes instructions of a program which is software to implement various functions, a read only memory (ROM) or a storage device (these are referred to as a "storage medium") in which the above-described program and various data are stored so as to be readable by a computer (or the CPU), and a random access memory (RAM) that deploys the above-described program. Then, the computer (or the CPU) reads out and executes the above-described program from the above-described storage medium to achieve the object of the disclosure. As the above-described storage medium, a "non-transitory tangible medium" such as a tape, a disk, a card, a semiconductor memory, or a programmable logic circuit can be used. Furthermore, the above-described program may be supplied to the above-described computer through any transmission medium that can transmit the program (a communication network, broadcast waves, or the like). Note that an aspect of the disclosure can also be implemented in the form of data signals that are embedded in carrier waves, in which the program is realized by electronic transmission.

Supplement

Aspect 1: A display device including a display portion including a plurality of pixel circuits each including an electro-optical element, the display portion being deformable and flexible, a rolling mechanism configured to roll the display portion and partially accommodate the display portion with a portion of the rolled display portion as a rolled area, a plurality of scanning signal lines extending in a direction intersecting a direction in which the display portion is drawn out from the rolling mechanism, a plurality of data signal lines intersecting the plurality of scanning signal lines and configured to input, to the plurality of pixel circuits, an analog voltage signal corresponding to an image to be displayed on the display portion, and a plurality of high power supply voltage wiring lines parallel to the plurality of data signal lines, in which the electro-optical element includes a first electrode, a second electrode provided in common to a plurality of the electro-optical elements, and a function layer interposed between the first electrode and the second electrode, the plurality of pixel circuits each include a write transistor and a drive transistor, and with a region of the display portion other than the rolled area defined as an unrolled area, and an edge portion of the unrolled area positioned on a side opposite to the rolling mechanism defined as an end portion, the display device further includes: a terminal portion provided in the end portion and configured to input a high power supply voltage to the plurality of high power supply voltage wiring lines from the outside, and input a low power supply voltage to the second electrode from the outside, a first high power supply voltage trunk wiring line provided on a terminal portion side in a frame region of the display portion and branching into the plurality of high power supply voltage wiring lines, a second high power supply voltage trunk wiring line provided on a side opposite to the terminal portion in the frame region and branching into the plurality of high power supply voltage wiring lines, and a plurality of switching elements, each being provided between the second high power supply voltage trunk wiring line and one of the plurality of high power supply voltage wiring lines and configured to input the high power supply voltage to corresponding high power supply voltage wiring lines of the plurality of high power supply voltage wiring lines.

Aspect 2: The display device according to Aspect 1, further including a high power supply voltage wiring line control signal line connected in common to control terminals of the plurality of switching elements.

Aspect 3: A display device including a display portion including a plurality of pixel circuits each including an electro-optical element, the display portion being deformable and flexible, a rolling mechanism configured to roll the display portion and accommodate the display portion with a portion of the rolled display portion as a rolled area, a plurality of scanning signal lines extending in a direction intersecting a direction in which the display portion is drawn out from the rolling mechanism, a plurality of data signal lines intersecting the plurality of scanning signal lines and configured to input, to the plurality of pixel circuits, an analog voltage signal corresponding to an image displayed on the display portion, and a plurality of high power supply voltage wiring lines parallel to the plurality of data signal lines, in which the electro-optical element includes a first electrode, a second electrode provided in common to a plurality of the electro-optical elements, and a function layer interposed between the first electrode and the second electrode, the plurality of pixel circuits each include a write transistor and a drive transistor, and, with a region other than the rolled area in the display portion defined as an unrolled area, and an edge portion of the unrolled area positioned on a side opposite to the rolling mechanism defined as an end portion, the display device further includes a terminal portion provided in the end portion and configured to input a high power supply voltage to the plurality of high power supply voltage wiring lines from the outside, and input a low power supply voltage to the second electrode from the outside, a first high power supply voltage trunk wiring line provided on the terminal portion side in a frame region of the display portion and branching into the plurality of high power supply voltage wiring lines, a second high power supply voltage trunk wiring line provided on a side opposite to the terminal portion in the frame region and branching into the plurality of high power supply voltage wiring lines, a third high power supply voltage trunk wiring line provided in the frame region and connected to the first high power supply voltage trunk wiring line and the second high power supply voltage trunk wiring line, a fourth high power supply voltage trunk wiring line provided on a side opposite to the third high power supply voltage trunk wiring line in the frame region and connected to the first high power supply voltage trunk wiring line and the second high power supply voltage trunk wiring line, a first switching element provided in the third high power supply voltage trunk wiring line and configured to input the high power supply voltage to the second high power supply voltage trunk wiring line, and a second switching element provided in the fourth high power supply voltage trunk wiring line and configured to input the high power supply voltage to the second high power supply voltage trunk wiring line.

Aspect 4: A display device including a display portion including a plurality of pixel circuits each including an electro-optical element, the display portion being deformable and flexible, a rolling mechanism configured to roll the display portion and accommodate the display portion with a portion of the rolled display portion as a rolled area, a plurality of scanning signal lines extending in a direction intersecting a direction in which the display portion is drawn out from the rolling mechanism, a plurality of data signal lines intersecting the plurality of scanning signal lines and configured to input, to a corresponding pixel circuit of the plurality of pixel circuits, an analog voltage signal corresponding to an image to be displayed on the display portion, and a plurality of high power supply voltage wiring lines parallel to the plurality of data signal lines, in which the electro-optical element includes a first electrode, a second electrode provided in common to a plurality of the electro-optical elements, and a function layer interposed between the first electrode and the second electrode, the plurality of pixel circuits each include a write transistor and a drive transistor, and with a region of the display portion other than the rolled area defined as an unrolled area, and an edge portion of the unrolled area located on a side opposite to the rolling mechanism defined as an end portion, the display device further includes, a terminal portion provided in the end portion and configured to input a high power supply voltage to the plurality of high power supply voltage wiring lines from the outside, and input a low power supply voltage to the second electrode from the outside, a first high power supply voltage trunk wiring line provided on a terminal portion side in a frame region of the display portion and branching into the plurality of high power supply voltage wiring lines, a second high power supply voltage trunk wiring line provided on a side opposite to the terminal portion in the frame region and branching into the plurality of high power supply voltage wiring lines, a third high power supply voltage trunk wiring line provided in the frame region and intersecting the first high power supply voltage trunk wiring line, a fourth high power supply voltage trunk wiring line provided on a side opposite to the third high power supply voltage trunk wiring line in the frame region, a plurality of intersecting high power supply voltage wiring lines that intersect the plurality of high power supply voltage wiring lines and branch off from the third high power supply voltage trunk wiring line and the fourth high power supply voltage trunk wiring line, a plurality of first switching elements, each being provided between the third high power supply voltage trunk wiring line and one of the plurality of intersecting high power supply voltage wiring lines and configured to supply the high power supply voltage to corresponding intersecting high power supply voltage wiring lines of the plurality of intersecting high power supply voltage wiring lines, and a plurality of second switching elements, each being provided between the fourth high power supply voltage trunk wiring line and one of the plurality of intersecting high power supply voltage wiring lines and configured to input the high power supply voltage to corresponding intersecting high power supply voltage wiring lines of the plurality of intersecting high power supply voltage wiring lines.

Aspect 5: The display device according to Aspect 4, further including a plurality of light emission control signal lines that intersect the plurality of data signal lines and correspond to the plurality of respective scanning signal lines on a one-to-one basis, in which a control terminal of each of the plurality of first switching elements is individually connected to any corresponding light emission control signal line of the plurality of light emission control signal lines, and a control terminal of each of the plurality of second switching elements is individually connected to any corresponding light emission control signal line of the plurality of light emission control signal lines.

Aspect 6: The display device according to any one of Aspects 1 to 5, further including a position sensor configured to detect the unrolled area, in which, among the plurality of scanning signal lines, a scanning signal is input to only a scanning signal line corresponding to the plurality of pixel circuits included in the unrolled area.

Aspect 7: The display device according to any one of Aspects 1 to 5, further including a plurality of light emission control signal lines that intersect the plurality of data signal lines and correspond to the plurality of respective scanning signal lines on a one-to-one basis, and a position sensor configured to detect the unrolled area, in which, among the plurality of light emission control signal lines, a light emission control signal is input to only a light emission control signal line corresponding to the plurality of pixel circuits included in the unrolled area.

Aspect 8: The display device according to any one of Aspects 1 to 5, further including a position sensor configured to detect the unrolled area, in which, among the plurality of data signal lines, the analog voltage signal is input to only a data signal line corresponding to the plurality of pixel circuits included in the unrolled area.

Aspect 9: The display device according to any one of Aspects 1 to 5, further including a position sensor configured to detect the unrolled area, and a display controller configured to control the display portion, in which the display controller determines, among the plurality of pixel circuits, a pixel circuit to which a signal is to be input based on detection results of the position sensor.

Aspect 10: The display device according to Aspect 9, wherein the display controller determines a portion for displaying an image in the unrolled area based on a length of the unrolled area drawn out from the rolling mechanism and an aspect ratio of the image displayed on the display portion.

Aspect 11: The display device according to any one of Aspects 1 to 3, further including a position sensor configured to detect the unrolled area, in which in a case where at least a portion of a display region of the display portion is accommodated in the rolling mechanism, control is performed such that an image is displayed in only the unrolled area in the display region, and a current does not flow between the second high power supply voltage trunk wiring line and the plurality of high power supply voltage wiring lines.

Aspect 12: The display device according to Aspect 4 or 5, further including a position sensor configured to detect the unrolled area, wherein in a case where at least a portion of a display region of the display portion is accommodated in the rolling mechanism, control is performed such that an image is displayed in only the unrolled area in the display region, and a current does not flow between the third high power supply voltage trunk wiring line and the plurality of intersecting high power supply voltage wiring lines and between the fourth high power supply voltage trunk wiring line and the plurality of intersecting high power supply voltage wiring lines.

Additional Items

The disclosure is not limited to the embodiments described above, and various modifications may be made within the scope of the claims. Embodiments obtained by appropriately combining technical approaches disclosed in each of the different embodiments also fall within the technical scope of the disclosure. Moreover, novel technical features can be formed by combining the technical approaches disclosed in each of the embodiments.

For example, the display device 1 may also be implemented as a display device 1 including all of the configurations according to the first to third embodiments.

The invention claimed is:

1. A display device comprising:
a display portion including a plurality of pixel circuits each including an electro-optical element, the display portion being deformable and flexible;
a rolling mechanism configured to roll the display portion and partially accommodate the display portion with a portion of the rolled display portion as a rolled area;
a plurality of scanning signal lines extending in a direction intersecting a direction in which the display portion is drawn out from the rolling mechanism;
a plurality of data signal lines intersecting the plurality of scanning signal lines and configured to input, to the plurality of pixel circuits, an analog voltage signal corresponding to an image to be displayed on the display portion; and
a plurality of high power supply voltage wiring lines parallel to the plurality of data signal lines,
wherein the electro-optical element includes a first electrode, a second electrode provided in common to a plurality of the electro-optical elements, and a function layer interposed between the first electrode and the second electrode,
the plurality of pixel circuits each include a write transistor and a drive transistor, and
with a region of the display portion other than the rolled area defined as an unrolled area, and an edge portion of the unrolled area positioned on a side opposite to the rolling mechanism defined as an end portion, the display device further includes:
a terminal portion provided in the end portion and configured to input a high power supply voltage to the plurality of high power supply voltage wiring lines from the outside, and input a low power supply voltage to the second electrode from the outside,
a first high power supply voltage trunk wiring line provided on a terminal portion side in a frame region of the display portion and branching into the plurality of high power supply voltage wiring lines,
a second high power supply voltage trunk wiring line provided on a side opposite to the terminal portion in the frame region and branching into the plurality of high power supply voltage wiring lines, and
a plurality of switching elements, each being provided between the second high power supply voltage trunk wiring line and one of the plurality of high power supply voltage wiring lines and configured to input the high power supply voltage to corresponding high power supply voltage wiring lines of the plurality of high power supply voltage wiring lines.

2. The display device according to claim 1, further comprising:
a high power supply voltage wiring line control signal line connected in common to control terminals of the plurality of switching elements.

3. A display device comprising:
a display portion including a plurality of pixel circuits each including an electro-optical element, the display portion being deformable and flexible;
a rolling mechanism configured to roll the display portion and accommodate the display portion with a portion of the rolled display portion as a rolled area;
a plurality of scanning signal lines extending in a direction intersecting a direction in which the display portion is drawn out from the rolling mechanism;
a plurality of data signal lines intersecting the plurality of scanning signal lines and configured to input, to the plurality of pixel circuits, an analog voltage signal corresponding to an image to be displayed on the display portion; and
a plurality of high power supply voltage wiring lines parallel to the plurality of data signal lines,
wherein the electro-optical element includes a first electrode, a second electrode provided in common to a plurality of the electro-optical elements, and a function layer interposed between the first electrode and the second electrode,
the plurality of pixel circuits each include a write transistor and a drive transistor, and
with a region of the display portion other than the rolled area defined as an unrolled area, and an edge portion of the unrolled area positioned on a side opposite to the rolling mechanism defined as an end portion, the display device further includes,
a terminal portion provided in the end portion and configured to input a high power supply voltage to the plurality of high power supply voltage wiring lines from the outside, and input a low power supply voltage to the second electrode from the outside,
a first high power supply voltage trunk wiring line provided on a terminal portion side in a frame region of the display portion and branching into the plurality of high power supply voltage wiring lines,
a second high power supply voltage trunk wiring line provided on a side opposite to the terminal portion in the frame region and branching into the plurality of high power supply voltage wiring lines,
a third high power supply voltage trunk wiring line provided in the frame region and connected to the first high power supply voltage trunk wiring line and the second high power supply voltage trunk wiring line,
a fourth high power supply voltage trunk wiring line provided on a side opposite to the third high power supply voltage trunk wiring line in the frame region and connected to the first high power supply voltage trunk wiring line and the second high power supply voltage trunk wiring line,
a first switching element provided in the third high power supply voltage trunk wiring line and configured to input the high power supply voltage to the second high power supply voltage trunk wiring line, and
a second switching element provided in the fourth high power supply voltage trunk wiring line and configured to input the high power supply voltage to the second high power supply voltage trunk wiring line.

4. A display device comprising:
a display portion including a plurality of pixel circuits each including an electro-optical element, the display portion being deformable and flexible;
a rolling mechanism configured to roll the display portion and accommodate the display portion with a portion of the rolled display portion as a rolled area;
a plurality of scanning signal lines extending in a direction intersecting a direction in which the display portion is drawn out from the rolling mechanism;
a plurality of data signal lines intersecting the plurality of scanning signal lines and configured to input, to a corresponding pixel circuit of the plurality of pixel circuits, an analog voltage signal corresponding to an image to be displayed on the display portion; and a plurality of high power supply voltage wiring lines parallel to the plurality of data signal lines, wherein the electro-optical element includes a first electrode, a second electrode provided in common to a plurality of the electro-optical elements, and a function layer interposed between the first electrode and the second electrode, the plurality of pixel circuits each include a write transistor and a drive transistor, and with a region of the display portion other than the rolled area defined as an unrolled area, and an edge portion of the unrolled area located on a side opposite to the rolling mechanism defined as an end portion, the display device further includes, a terminal portion provided in the end portion and configured to input a high power supply voltage to the plurality of high power supply voltage wiring lines from the outside, and input a low power supply voltage to the second electrode from the outside, a first high power supply voltage trunk wiring line provided on a terminal portion side in a frame region of the display portion and branching into the plurality of high power supply voltage wiring lines, a second high power supply voltage trunk wiring line provided on a side opposite to the terminal portion in the frame region and branching into the plurality of high power supply voltage wiring lines, a third high power supply voltage trunk wiring line provided in the frame region and intersecting the first high power supply voltage trunk wiring line, a fourth high power supply voltage trunk wiring line provided on a side opposite to the third high power supply voltage trunk wiring line in the frame region, a plurality of intersecting high power supply voltage wiring lines that intersect the plurality of high power supply voltage wiring lines and branch off from the third high power supply voltage trunk wiring line and the fourth high power supply voltage trunk wiring line, a plurality of first switching elements, each being provided between the third high power supply voltage trunk wiring line and one of the plurality of intersecting high power supply voltage wiring lines and configured to input the high power supply voltage to corresponding intersecting high power supply voltage wiring lines of the plurality of intersecting high power supply voltage wiring lines, and a plurality of second switching elements, each being provided between the fourth high power supply voltage trunk wiring line and one of the plurality of intersecting high power supply voltage wiring lines and configured to input the high power supply voltage to corresponding intersecting high power supply voltage wiring lines of the plurality of intersecting high power supply voltage wiring lines.

5. The display device according to claim 4, further comprising:

a plurality of light emission control signal lines that intersect the plurality of data signal lines and correspond to the plurality of respective scanning signal lines on a one-to-one basis, wherein a control terminal of each of the plurality of first switching elements is individually connected to any corresponding light emission control signal line of the plurality of light emission control signal lines, and a control terminal of each of the plurality of second switching elements is individually connected to any corresponding light emission control signal line of the plurality of light emission control signal lines.

6. The display device according to claim 1, further comprising:

a position sensor configured to detect the unrolled area, wherein, among the plurality of scanning signal lines, a scanning signal is input to only a scanning signal line corresponding to the plurality of pixel circuits included in the unrolled area.

7. The display device according to claim 1, further comprising:

a plurality of light emission control signal lines that intersect the plurality of data signal lines and correspond to the plurality of scanning signal lines on a one-to-one basis; and a position sensor configured to detect the unrolled area, wherein, among the plurality of light emission control signal lines, a light emission control signal is input to only a light emission control signal line corresponding to the plurality of pixel circuits included in the unrolled area.

8. The display device according to claim 1, further comprising:

a position sensor configured to detect the unrolled area, wherein, among the plurality of data signal lines, the analog voltage signal is input to only a data signal line corresponding to the plurality of pixel circuits included in the unrolled area.

9. The display device according to claim 1, further comprising:

a position sensor configured to detect the unrolled area; and a display controller configured to control the display portion, wherein the display controller determines, among the plurality of pixel circuits, a pixel circuit to which a signal is to be input based on detection results of the position sensor.

10. The display device according to claim 9, wherein the display controller determines a portion for displaying an image in the unrolled area based on a length of the unrolled area drawn out from the rolling mechanism and an aspect ratio of the image displayed on the display portion.

11. The display device according to claim 1, further comprising:

a position sensor configured to detect the unrolled area, wherein, in a case where at least a portion of a display region of the display portion is accommodated in the rolling mechanism, control is performed such that an image is displayed in only the unrolled area in the display region and a current does not flow between the second high power supply voltage trunk wiring line and the plurality of high power supply voltage wiring lines.

12. The display device according to claim 4, further comprising:

a position sensor configured to detect the unrolled area, wherein, in a case where at least a portion of a display region of the display portion is accommodated in the rolling mechanism, control is performed such that an image is displayed in only the unrolled area in the display region and a current does not flow between the third high power supply voltage trunk wiring line and the plurality of intersecting high power supply voltage wiring lines and between the fourth high power supply voltage trunk wiring line and the plurality of intersecting high power supply voltage wiring lines.

\* \* \* \* \*